(12) United States Patent
Deng et al.

(10) Patent No.: US 11,495,555 B2
(45) Date of Patent: Nov. 8, 2022

(54) MAGNETIC BILAYER STRUCTURE FOR A CORED OR CORELESS SEMICONDUCTOR PACKAGE

(71) Applicant: Intel Corporation, Santa Clara, CA (US)

(72) Inventors: Yikang Deng, Chandler, AZ (US); Jonathan Rosch, Mesa, AZ (US); Andrew Brown, Chandler, AZ (US); Junnan Zhao, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 952 days.

(21) Appl. No.: 15/921,511

(22) Filed: Mar. 14, 2018

(65) Prior Publication Data

US 2019/0287934 A1 Sep. 19, 2019

(51) Int. Cl.
| | | |
|---|---|---|
| *H01L 23/64* | (2006.01) | |
| *H01L 23/498* | (2006.01) | |
| *H01F 27/40* | (2006.01) | |
| *H01L 21/48* | (2006.01) | |

(52) U.S. Cl.
CPC .......... *H01L 23/645* (2013.01); *H01F 27/40* (2013.01); *H01L 21/4857* (2013.01); *H01L 21/4867* (2013.01); *H01L 23/49822* (2013.01); *H01L 23/49838* (2013.01); *H01L 23/49894* (2013.01)

(58) Field of Classification Search
CPC ............ H01L 23/645; H01L 23/49822; H01L 23/49838; H01L 21/4867; H01L 21/4857; H01L 23/49894; H01L 23/49883; H01L 2924/15311; H01L 2224/16227; H01L 2224/48227; H01L 24/16; H01L 24/48; H01F 27/40; H01F 2017/0066; H01F 17/0006
USPC ......................................................... 257/531
See application file for complete search history.

(56) References Cited

U.S. PATENT DOCUMENTS

| | | | |
|---|---|---|---|
| 2005/0099259 A1* | 5/2005 | Harris | ..................... H01L 24/13 336/200 |
| 2006/0152321 A1* | 7/2006 | Jung | .................... H01F 17/0006 336/200 |
| 2008/0026588 A1* | 1/2008 | Hwang | ............. H01L 21/31144 438/703 |

(Continued)

*Primary Examiner* — Duy T Nguyen
(74) *Attorney, Agent, or Firm* — Schwabe, Williamson & Wyatt P.C.

(57) ABSTRACT

Techniques for fabricating a cored or coreless semiconductor package having one or more magnetic bilayer structures embedded therein are described. A magnetic bilayer structure includes a magnetic layer and a dielectric layer. For one technique, fabricating a cored or coreless semiconductor package includes: depositing a seed layer on a build-up layer; forming a raised pad structure and a trace on the seed layer; removing one or more uncovered portions of the seed layer to uncover top surfaces of one or more portions of the build-up layer; applying a magnetic bilayer structure on the raised pad structure, the trace, any unremoved portion of the seed layer, and the top surfaces of the one or more portions of the build-up layer, the magnetic bilayer structure comprises a magnetic layer and a dielectric layer; and forming a conductive structure on the raised pad structure. Other techniques are also described.

13 Claims, 27 Drawing Sheets

(56) References Cited

U.S. PATENT DOCUMENTS

| | | | | |
|---|---|---|---|---|
| 2009/0185315 A1* | 7/2009 | Xue | ....................... | B82Y 10/00 |
| | | | | 360/314 |
| 2009/0243780 A1* | 10/2009 | Inoue | ....................... | H01F 1/37 |
| | | | | 336/200 |
| 2010/0109106 A1* | 5/2010 | Zhong | ................... | H01L 27/228 |
| | | | | 257/421 |
| 2015/0077209 A1* | 3/2015 | Fujii | ................... | H01F 17/0006 |
| | | | | 336/200 |
| 2016/0172580 A1* | 6/2016 | Matsubara | .............. | H01L 24/97 |
| | | | | 257/422 |
| 2016/0276074 A1* | 9/2016 | Lee | .......................... | H01F 1/24 |
| 2016/0359100 A1* | 12/2016 | Bhushan | ............... | H01L 23/552 |
| 2018/0075965 A1* | 3/2018 | Yoshioka | ............ | H01F 27/2823 |
| 2018/0315706 A1* | 11/2018 | Liao | ....................... | H01L 24/06 |

* cited by examiner

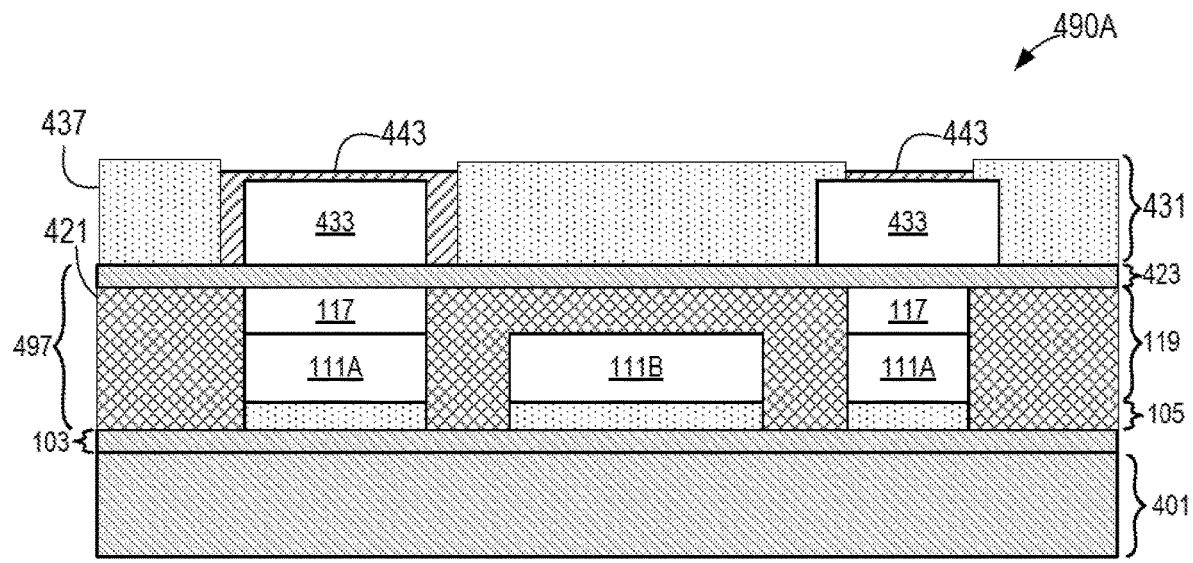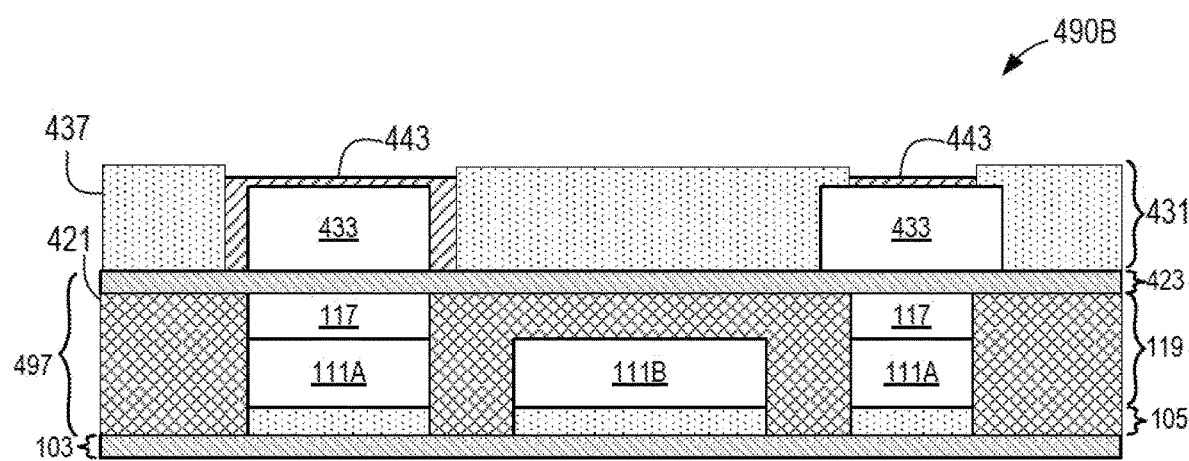
FIG. 4I

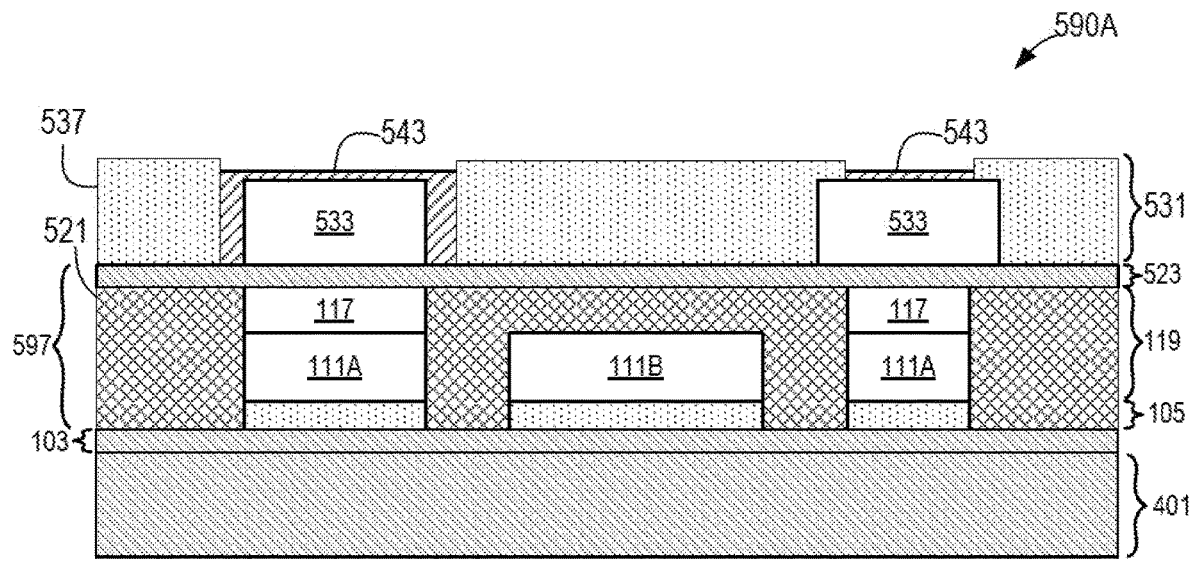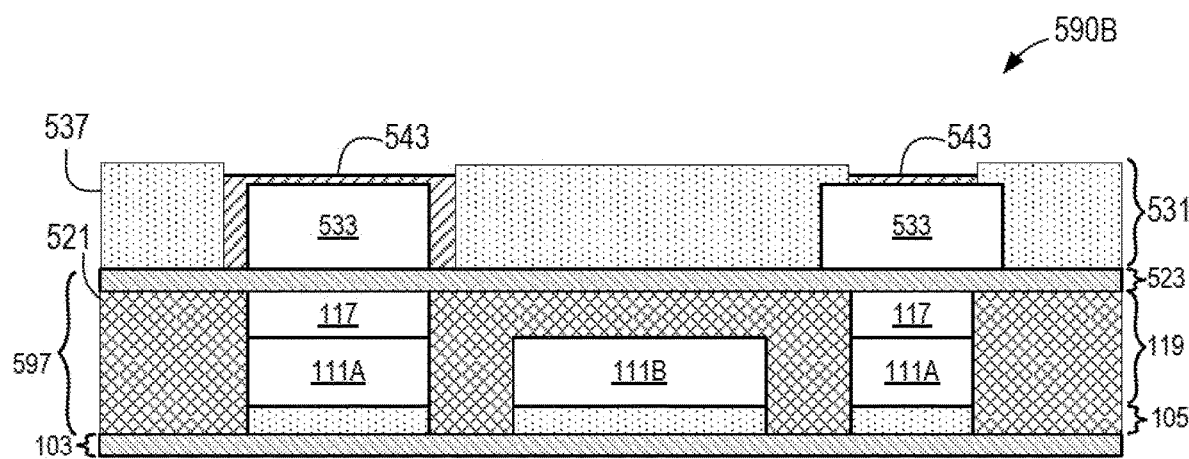
FIG. 5G

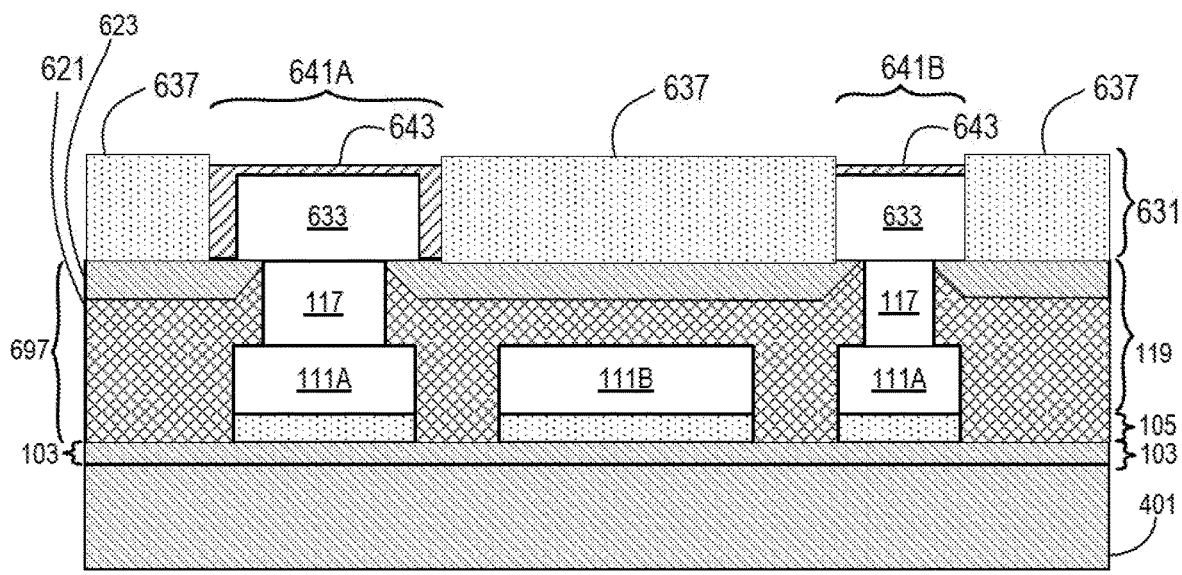
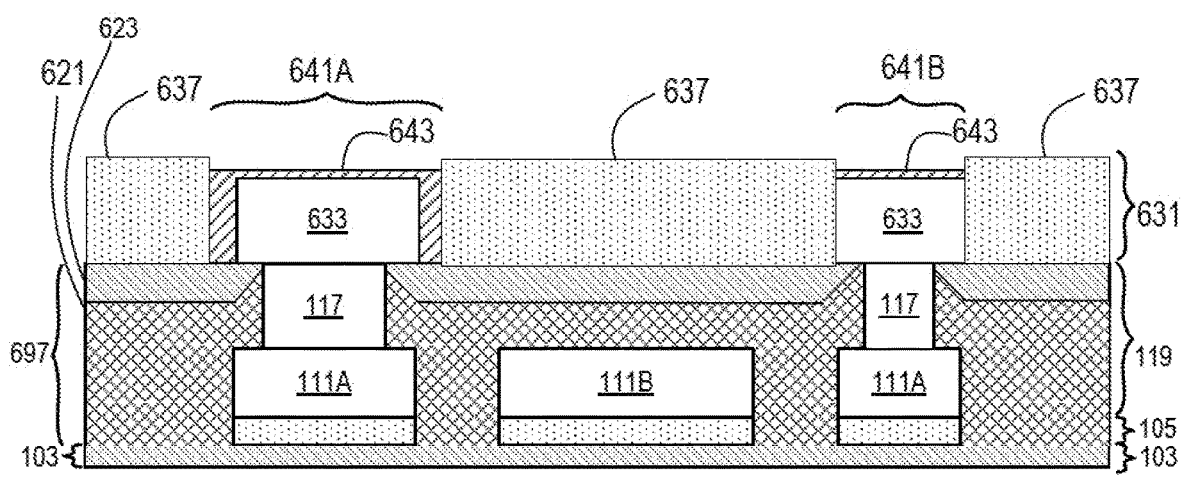
FIG. 6G

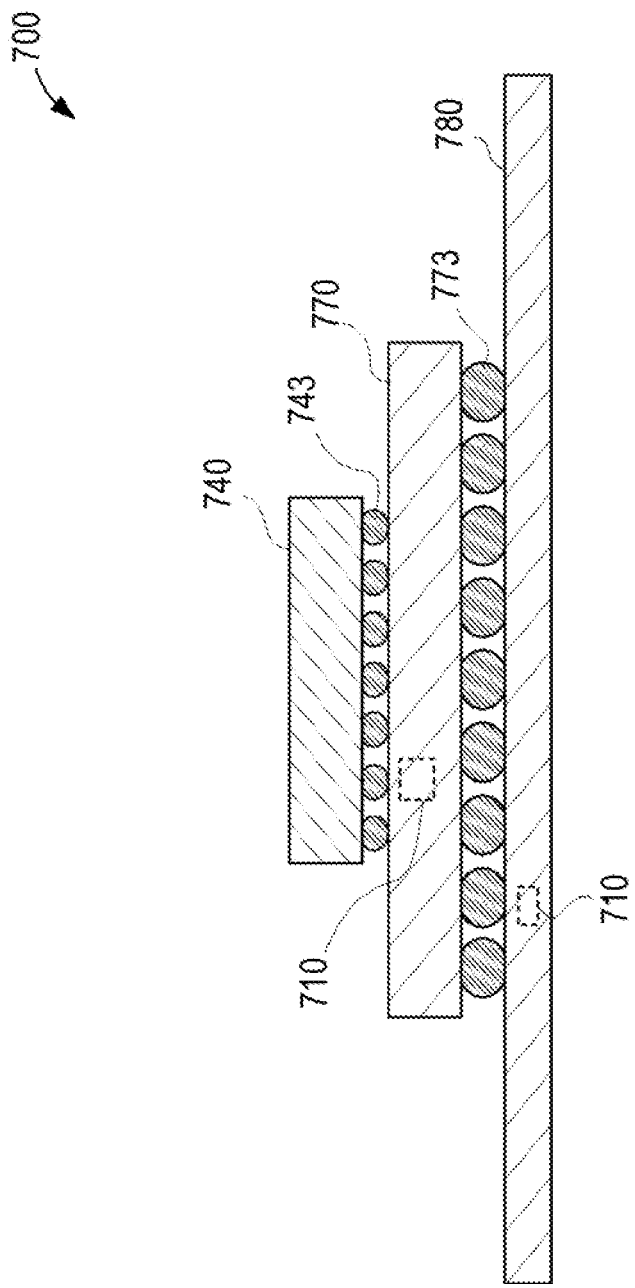

MAGNETIC BILAYER STRUCTURE FOR A CORED OR CORELESS SEMICONDUCTOR PACKAGE

BACKGROUND

Field

Embodiments described herein relate to semiconductor packages. More specifically, the described embodiments are directed to semiconductor packages having one or more magnetic bilayer structures embedded therein and techniques of forming such packages.

Background Information

An inductor is a passive electronic component that is typically included in a semiconductor package comprising a package substrate and one or more semiconductor dies on the package substrate. In such packages, one or more inductors can form a functional or fully integrated voltage regulator (IVR). An IVR can provide one or more voltage regulators for semiconductor die(s) within a semiconductor package.

Inductors used in semiconductor packages can take multiple forms. Examples include, but are not limited to, discrete inductors and air core inductors (ACIs). Discrete inductors are generally prepackaged inductor devices (e.g., off-chip, off-package devices comprising one or more inductors, etc.). Discrete inductors typically include at least one magnetic core inductor (MCI). An MCI is an inductor comprising an insulated wire wound into a coil around a magnetic core made of a ferromagnetic or ferrimagnetic material (e.g., iron, ferrite, etc.). A magnetic core can increase the inductance of a coil by increasing the magnetic field. This increase is due to the magnetic core's higher magnetic permeability (as opposed to the relatively lower magnetic permeability of the coil itself or of a non-magnetic core such as air, glass, mica, plastic, ceramic, or any other dielectric material). Most discrete inductors are proprietary to and outsourced from third party vendors. These inductors are embedded in or surface mounted on a package substrate during semiconductor package fabrication. As used herein, a "package substrate" includes one or more of: (i) a package substrate core formed from any suitable material; and (ii) one or more layers (e.g., a metal layer, an interlayer dielectric layer, a build-up layer, a seed layer, any other layer known in the art of semiconductor manufacturing and/or packaging, etc.).

There are some drawbacks associated with discrete inductors. Discrete inductors can be costly (when compared to ACIs). Also, the embedding processes used to incorporate discrete packages into semiconductor packages can be complicated. Additionally, the surface mounting processes used to incorporate discrete packages into semiconductor packages can add an undesired thickness (e.g., z-height, etc.) to the overall thickness of the resulting semiconductor package. Discrete inductors might also require extra space outside a semiconductor package, which can be difficult to achieve in high-density microelectronic devices. Additionally, because discrete inductors are usually prepackaged devices that are proprietary to third party vendors, package design may be limited.

ACIs are typically embedded in semiconductor packages. Conventional ACI formation involves forming one or more features, portions, or constituent parts of an inductor ("inductor features") on or in one or more layers of a package substrate. For example, conductive lines may be patterned on a layer to form one or more inductor features. Examples of inductor features include, but are not limited to, a coil having any shape (e.g., a loop, a square, a circle, a spiral, etc.) formed from conductive lines and one or more pads. Generally, an ACI formed in a semiconductor package does not include a magnetic core. As a result, an ACI's magnetic permeability can be lower than an MCI's magnetic permeability. For example, the magnetic permeability of an ACI may be approximately equal or equal to the magnetic permeability of air. Examples of conductive lines are copper lines, aluminum lines, lines formed from any other metal or metal alloy as is known in the art of semiconductor packaging and/or manufacturing, etc. Conductive lines may be referred as traces.

ACIs have some drawbacks even though they can be less expensive than discrete inductors. One drawback is that ACIs may not generate inductance as effectively or as efficiently as discrete inductors. Another drawback is that ACIs can take up valuable real estate in a package substrate in order to generate a target inductance, which can in turn reduce the achievable input/output (I/O or IO) density per mm per layer (IO/mm/layer) in a semiconductor package.

Several proposals for inductors that lack the drawbacks described above are in existence. One proposal is to fabricate an ACI comprising a magnetic material (e.g., one or more magnetic fillers, a film comprising one or more magnetic fillers, a paste composition comprising one or more magnetic fillers, an ink comprising one or more magnetic fillers, etc.). Magnetic materials can increase an ACI's magnetic permeability, which can in turn enhance the ACI's performance. Magnetic materials, however, are not easily integrated into current semiconductor fabrication processes that comply with current industry standards. One drawback associated with the magnetic material(s) is that laser drilling of vias through the magnetic material(s) may be difficult, costly, or complicated. For a first example, after laser drilling of a magnetic material to form vias is performed, some of the material's magnetic fillers are not ablated away, which in turn leaves via residue in resulting vias creating unwanted "dirty vias." Another drawback associated with the magnetic material(s) is a risk of contamination of bath chemistries associated with wet processes and/or a risk of contamination of tools or materials used in etching techniques. For example, magnetic fillers in the magnetic material(s) may have negative, undesirable, or unexpected interactions with bath chemistries, materials, and/or tools used in, for example, desmearing processes, electroless plating processes, flash etching processes, soft etching processing, seed etching processes, processes involving roughening baths. For another example, introduction of magnetic material(s) to certain bath chemistries may result in corrosion, destruction, dissolution, or degradation of the magnetic fillers in the magnetic material(s). For this example, corrosion of the magnetic fillers may cause the magnetic fillers to leach into bath chemistries, which can in turn contaminate the baths and reduce the life cycle of the baths. Consequently, and for this example, a semiconductor package formed using the contaminated baths and the magnetic material(s) may exhibit suboptimal properties (e.g., suboptimal electrical performance, etc.).

One proposal to minimize or eliminate the drawbacks described above is to tailor the magnetic material(s) described above to current semiconductor fabrication processes that comply with current industry standards. Another proposal to minimize or eliminate the drawbacks described above is to tailor bath chemistries associated with wet processes and/or tools or materials used in etching techniques to work with the magnetic material(s) described above. These tailoring processes, however, can be time-consuming and expensive endeavors, which can in turn increase costs associated with semiconductor manufacturing and/or packaging. Furthermore, these tailoring processes may run a risk of over-engineering—that is, the magnetic material(s), the bath chemistries associated with wet processes, and/or the tools or materials used in etching techniques may be suboptimally designed. For example, a specific type of magnetic filler with suboptimal magnetic permeability properties (when compared to other types of magnetic fillers) may be used to form the magnetic material(s). For this example, the chosen magnetic filler is used despite the existence of other magnetic fillers with more optimal magnetic permeability properties in order to minimize or eliminate one or more of the drawbacks described above in connection with magnetic material(s).

BRIEF DESCRIPTION OF THE DRAWINGS

Embodiments described herein are illustrated by way of example and not limitation in the figures of the accompanying drawings, in which like references indicate similar features. Furthermore, in the figures, some conventional details have been omitted so as not to obscure from the inventive concepts described herein.

FIGS. 4A-4I are cross-sectional side view illustrations of a method of forming a cored or coreless semiconductor package having one or more magnetic bilayer structures embedded therein according to one embodiment.

FIGS. 5A-5G are cross-sectional side view illustrations of a method of forming a cored or coreless semiconductor package having one or more magnetic bilayer structures embedded therein according to one embodiment.

FIGS. 6A-6G are cross-sectional side view illustrations of a method of forming a cored or coreless semiconductor package having one or more magnetic bilayer structures embedded therein according to one embodiment.

FIG. 7 illustrates a cross-sectional illustration of a packaged system, according to an embodiment.

DETAILED DESCRIPTION

Figure 1A:
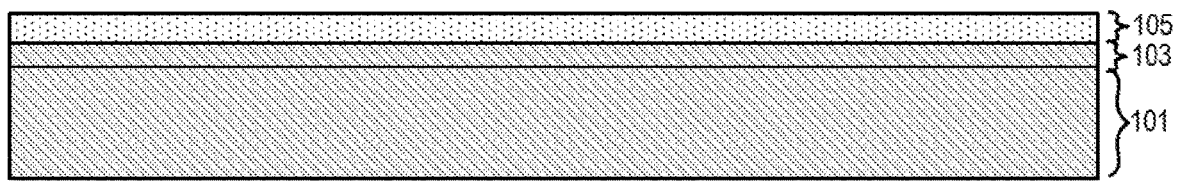
FIGS. 1A-1S are cross-sectional side view illustrations of a method of forming a coreless semiconductor package having one or more magnetic bilayer structures embedded therein according to one embodiment.

Embodiments described herein provide techniques that can assist with fabricating a cored or coreless semiconductor package having one or more magnetic bilayer structures embedded therein. For one or more embodiments, an inductor in a cored or coreless semiconductor package comprises one or more magnetic bilayer structures. Several advantages are provided by the embodiments described herein. One advantage is that the embodiment(s) described herein can assist with creating a chemically resilient technique of manufacturing an inductor comprising one or more magnetic bilayer structures in a cored or coreless semiconductor package. Another advantage is that the embodiment(s) described herein can assist with providing flexibility towards the choice of materials used for fabricating a cored or coreless semiconductor package. Yet another advantage is that magnetic bilayer structure(s), which are in a semiconductor package that is fabricated in accordance with one or more of the embodiments described herein, are isolated from interacting with bath chemistries, materials, and/or tools used in desmearing processes, electroless plating processes, seed etching processes, processes involving roughening baths, etc. One more advantage of the embodiments described herein is that no investment in specialized equipment is required to perform the techniques described herein. Another advantage is that the magnetic bilayer structure(s) can be embedded in any package substrate used to form a semiconductor package. In this way, one or more drawbacks associated with magnetic materials as described above may be minimized or eliminated, which can in turn reduce costs associated with semiconductor manufacturing and/or packaging, with increasing the achievable IO/mm/layer in a semiconductor package, with enhancing one or more properties of a semiconductor package (e.g., enhancing a package's electrical performance, etc.), and with reducing a thickness (e.g., z-height, etc.) of a semiconductor package.

As used herein, the phrase "magnetic bilayer structure" and its variations comprise: (i) a magnetic layer; and (ii) a dielectric layer.

As used herein, the phrase "magnetic layer" and its variations refer to layer formed from a magnetic material.

As used herein, the phrase "dielectric layer" and its variations refer to layer formed from a dielectric material.

As used herein, the phrase "magnetic material" and its variations include, but are not limited to, one or more magnetic fillers, a magnetic film comprising a magnetic filler, a magnetic paste composition comprising a magnetic filler, and a magnetic ink comprising a magnetic filler. Magnetic fillers may be formed from iron, ferrite, any other ferromagnetic or ferrimagnetic material, any other suitable material or combination of materials having magnetic properties, alloys comprising any of the preceding examples, or any combination thereof. Examples of magnetic fillers include, but are not limited to, iron (Fe), cobalt (Co), nickel (Ni), any ferrite that includes Fe and oxygen (O), ferrous oxide (FeO), a metal alloy comprising one or more of Fe, Co, and Ni (e.g., CoFe, NiFe, etc.), any ferromagnetic material, any ferrimagnetic material, and any combination thereof."

As used herein, the phrase "magnetic film" and its variations include, but are not limited to, a dielectric laminate film having one or more magnetic fillers embedded therein, an epoxy laminate film having one or more magnetic fillers embedded therein, an organic laminate film having one or more magnetic fillers embedded therein, an organic dielectric epoxy laminate film having one or more magnetic fillers embedded therein, a laminate film formed from any suitable material or combination of materials capable of having one or more magnetic fillers embedded therein, and any combination of two or more of the preceding films. For one embodiment, a magnetic film comprises: (i) one or more of an epoxy resin, a polyimide, and a glass-reinforced epoxy laminate material (e.g., FR4, G10, G11, FR4, FR5, FR6, etc.); and (ii) one or more magnetic fillers. One specific example of a magnetic film is an organic dielectric epoxy laminate film having magnetic fillers embedded therein.

As used herein, the phrase "magnetic paste composition", "magnetic paste", and their variations include, but are not limited to, a magnetically permeable paste having one or more magnetic fillers embedded therein. One non-limiting example of a magnetic paste composition is a paste comprising: (i) a suitable material (e.g., metallic material, polymeric material, any suitable organic material, any suitable inorganic material, any combination thereof, etc.); and (ii) one or more magnetic fillers. Another non-limiting example of a magnetic paste is a non-conductive epoxy or a polymer filled with one or more magnetic fillers. Yet another non-limiting example of a magnetic paste is a magnetic paste comprising: (i) any suitable magnetic paste powder known in the art of semiconductor manufacturing and/or fabrication (e.g., manganese zinc ferrite, any other suitable magnetic paste, any combination of suitable magnetic pastes, etc.); and (ii) one or more magnetic fillers.

As used herein, the phrase "magnetic ink" and its variations include, but are not limited to, a magnetically permeable ink having magnetic fillers embedded therein. One non-limiting example of a magnetic ink is an ink comprising: (i) a suitable material (e.g., metallic material, polymeric material, any suitable organic material, any suitable inorganic material, any combination thereof, etc.); and (ii) one or more magnetic fillers.

As used herein, a "dielectric material" comprises any dielectric material that exhibits a low electrical conductivity, in which an electric field can be sustained with a minimal leakage. Some dielectric materials can store electrical energy/charge. For one embodiment, a dielectric material lacks magnetic fillers. For one embodiment, a dielectric material is an electrically insulative and/or high permittivity dielectric material. A dielectric material can comprise one or more of the following: (i) an organic dielectric material; and (ii) an inorganic dielectric materials. An example of dielectric material is a dielectric film.

As used herein, the phrase "dielectric film" and its variations include, but are not limited to, a dielectric laminate film having no magnetic fillers embedded therein, an epoxy laminate film having no magnetic fillers embedded therein, an organic laminate film having no magnetic fillers embedded therein, an organic dielectric epoxy laminate film having no magnetic fillers embedded therein, a laminate film formed from any suitable material or combination of materials that has no magnetic fillers embedded therein, and any combination of two or more of the preceding films. For one embodiment, a dielectric film comprises one or more of an epoxy resin having no magnetic fillers embedded therein, a polyimide having no magnetic fillers embedded therein, and a glass-reinforced epoxy laminate material having no magnetic fillers embedded therein (e.g., FR4, G10, G11, FR4, FR5, FR6, etc.). One non-limiting example of a dielectric film is an organic dielectric epoxy laminate film having no magnetic fillers embedded therein. Another non-limiting example of a dielectric film is a dielectric film formed using an epoxy dielectric material (e.g., an Ajinomoto Build-up Film (ABF), etc.), where the dielectric film has no magnetic fillers embedded therein. There are different types of ABFs. Examples of the different types of ABFs include, but are not limited to, GX13, GX92, GX-T31, and GZ41. Two or more of the ABFs may be combined in one or more embodiments of a dielectric film described herein.

As used herein, the phrase "the art", "the art of semiconductor manufacturing and/or packaging" and their variations as used herein comprise one or more of: (i) the art of semiconductor manufacturing; (ii) the art of semiconductor packaging; (iii) the field of semiconductor manufacturing; and (iv) the field of semiconductor packaging.

A cored or coreless semiconductor package fabricated according to one or more of the embodiments described herein comprises one or more of the following: (i) one or more lithography-defined vias; and (ii) one or more magnetic bi-layer structures. For one or more embodiments, a magnetic bilayer structure comprises (i) a magnetic film; and (ii) a dielectric film. For one or more embodiments, fabricating a magnetic bilayer structure comprising a magnetic film and a dielectric film comprises laminating the magnetic and dielectric films with or on each other simultaneously or separately. For one or more embodiments, the magnetic and dielectric films are laminated between two or more layers (e.g., a metal layer, an interlayer dielectric layer, a build-up layer, a seed layer, any other layer known in the art, etc.).

For one or more embodiments, forming a cored or coreless semiconductor package having one or more magnetic bilayer structures embedded therein includes, at least in part, application of one or more of the following processes: (i) one or more lithography techniques (e.g., any known photolithography and/or lithography techniques, etc.); and (ii) one or more via-formation techniques (e.g., techniques of forming zero-misalignment vias, techniques of forming self-aligned vias, any other suitable via-formation technique, any combination of suitable via-formation techniques, etc.).

For one or more embodiment, forming a cored or coreless semiconductor package comprises depositing a seed layer on a build-up layer; forming a raised pad structure and a trace on the seed layer; removing one or more uncovered portions of the seed layer to uncover top surfaces of one or more portions of the build-up layer; applying a magnetic bilayer structure on the raised pad structure, the trace, one or more unremoved portions of the seed layer, and the top surfaces of the one or more portions of the build up layer, the magnetic bilayer structure comprises a magnetic layer and a dielectric layer; and forming a conductive structure on the raised pad structure. Other embodiments are described below in connection with FIGS. 1A-7.

Each of the methods described below in connection with FIGS. 1A-7 omits one or more processes, operations, and/or steps known in the art for simplicity and to avoid obscuring or convoluting one or more of the inventive concepts described herein.

Figure 1B:
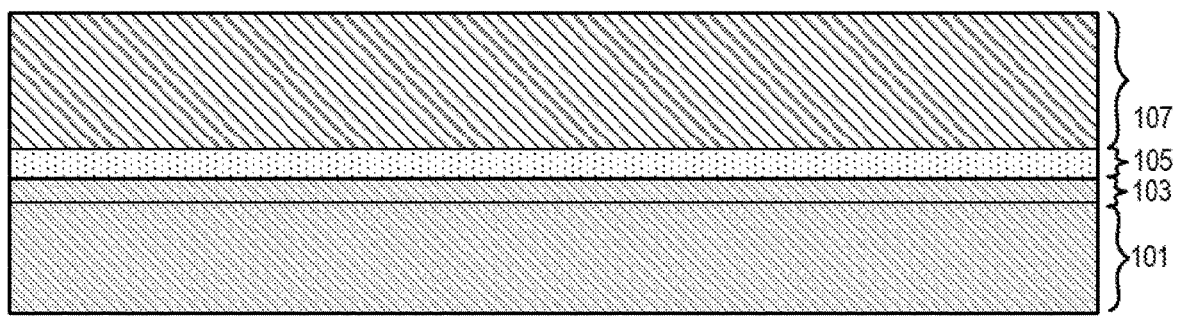
Figure 1C:
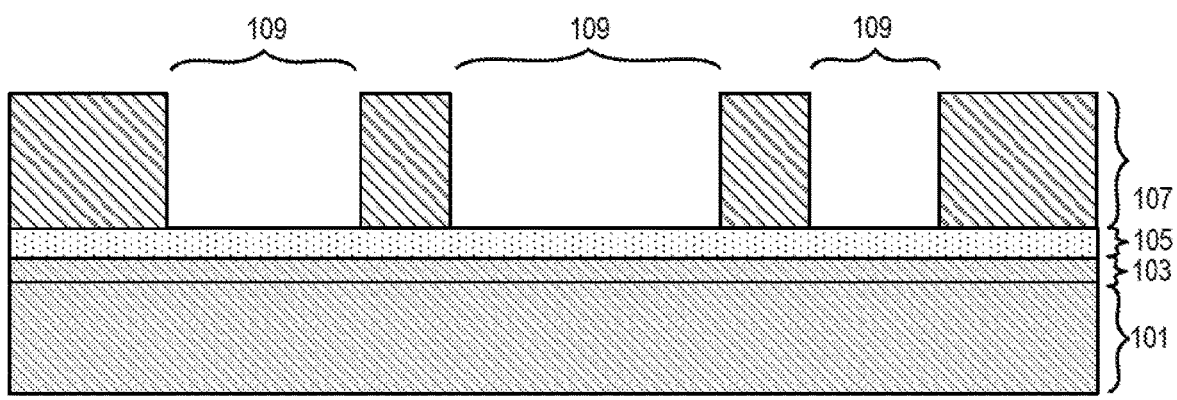
Figure 1D:
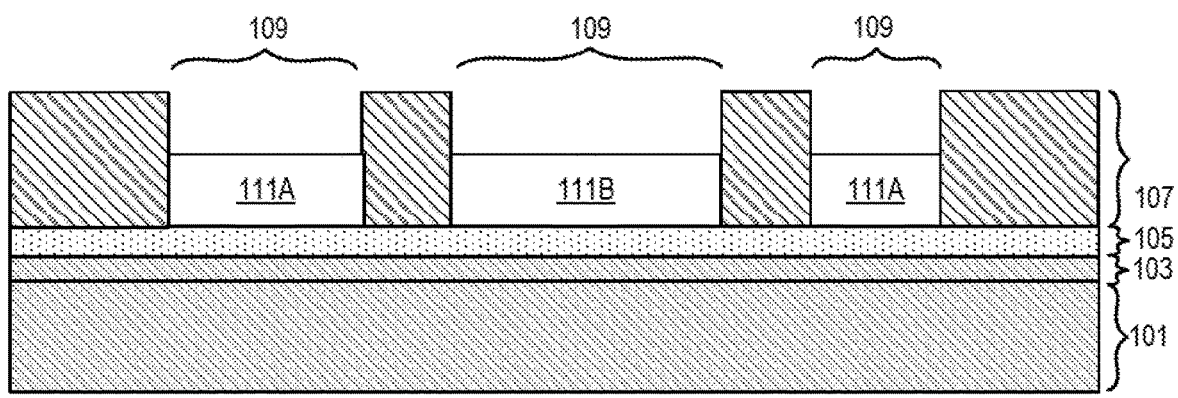
Figure 1E:
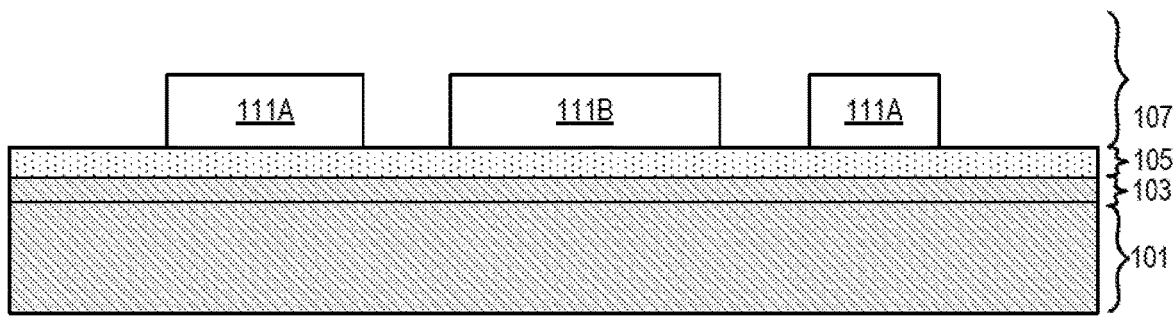
Figure 1F:
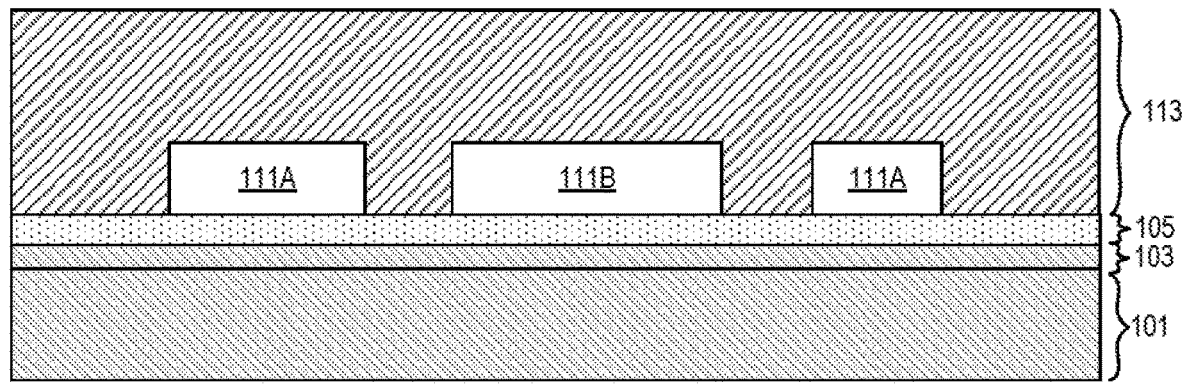
Figure 1G:
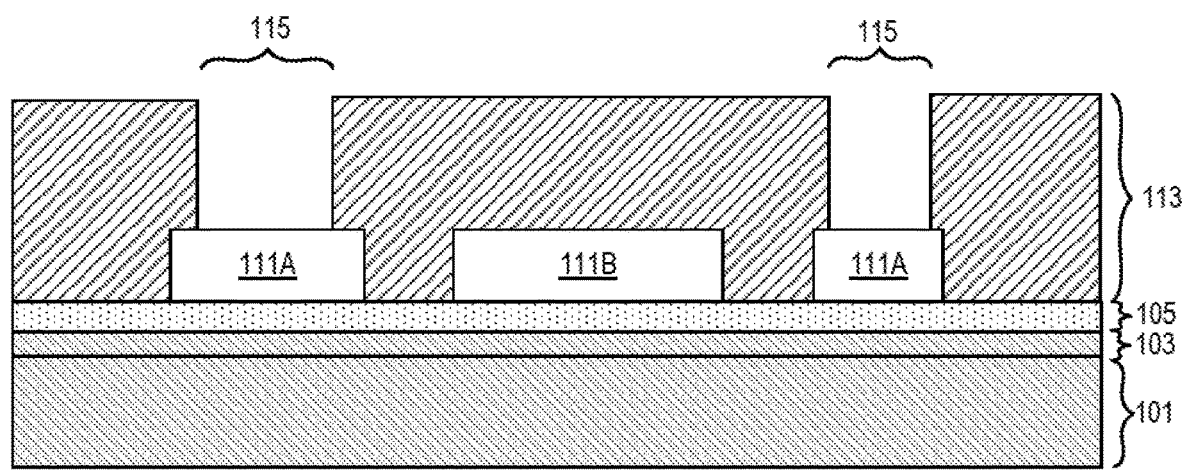
Figure 1H:
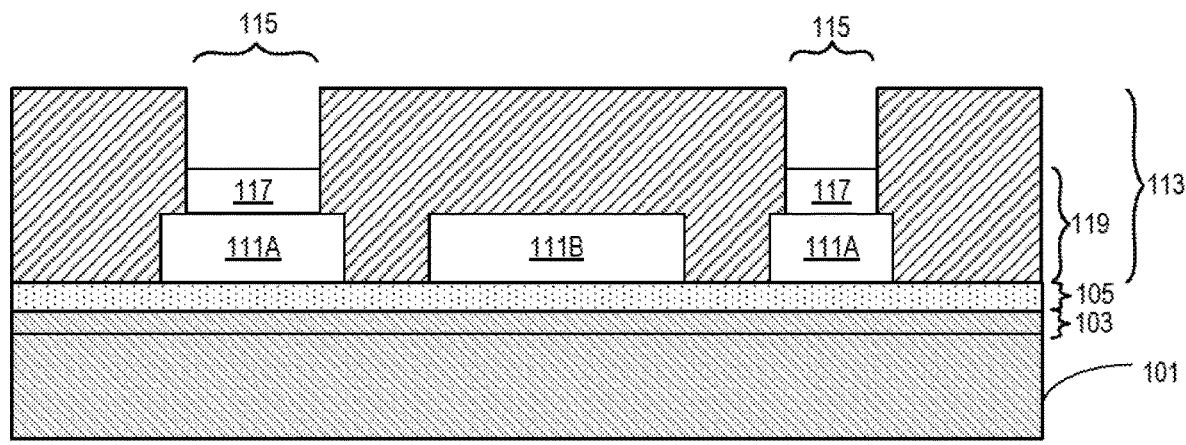
Figure 1I:
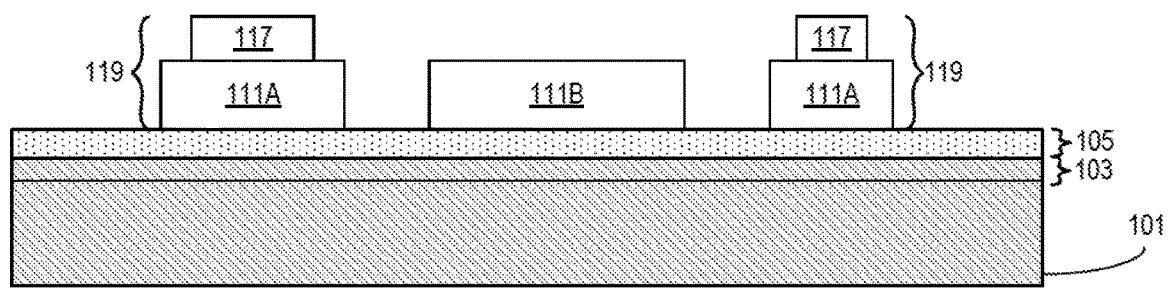
Figure 1J:
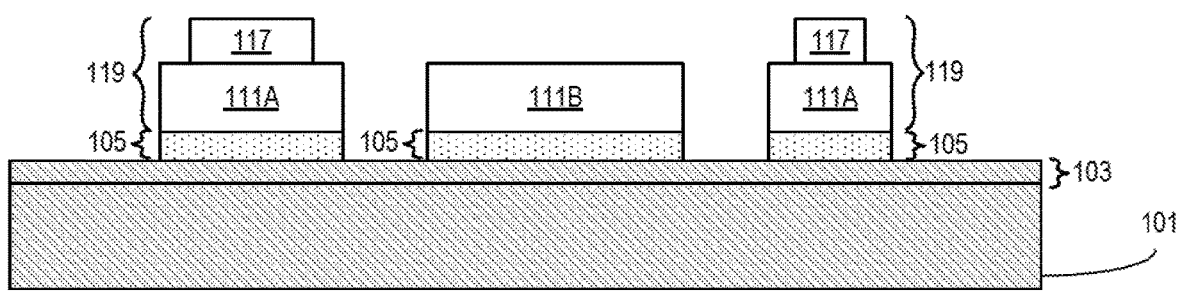
Figure 1K:
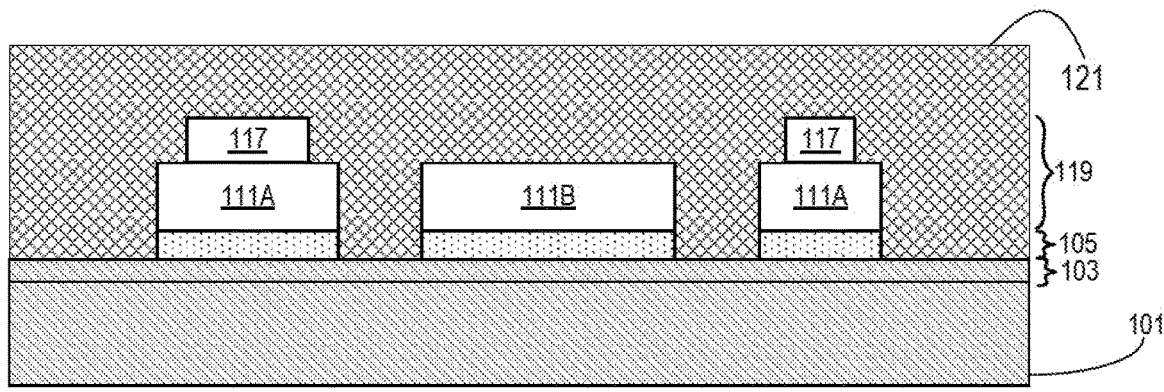
Figure 1L:
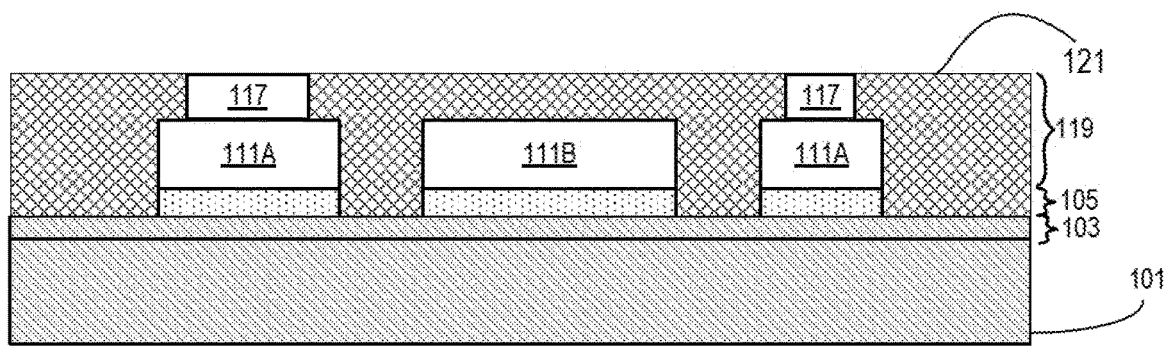
Figure 1M:
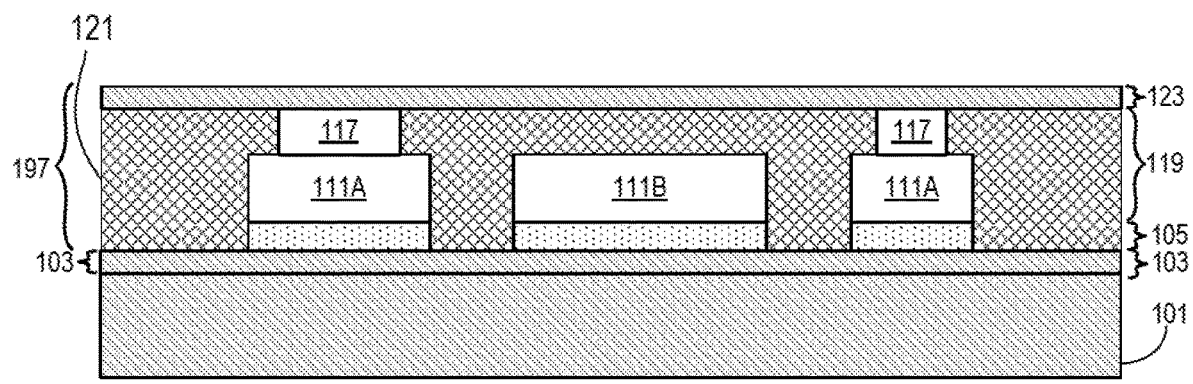
Figure 1N:
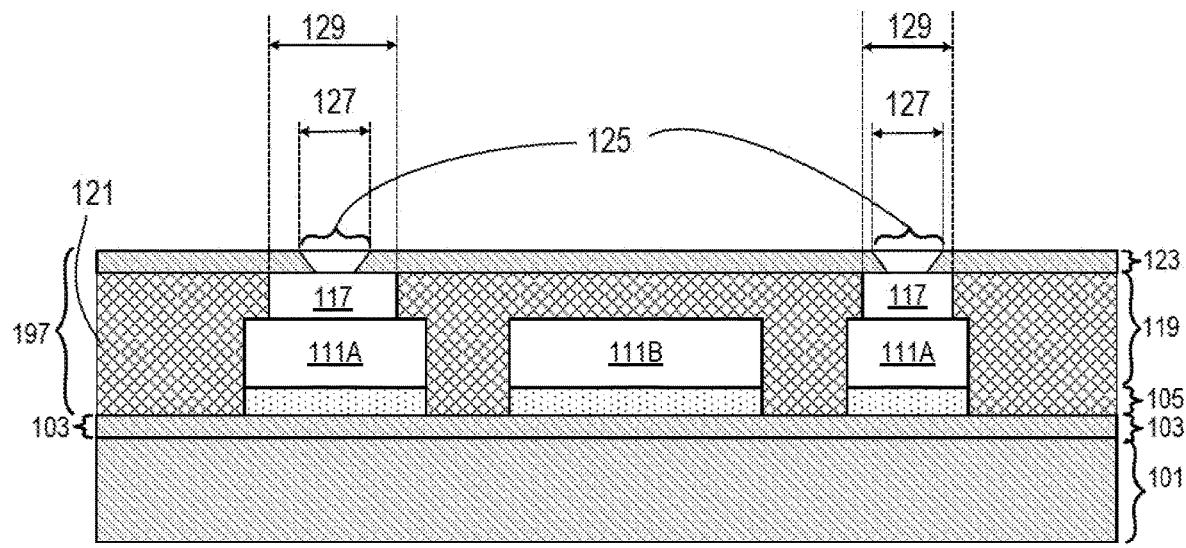
Figure 1O:
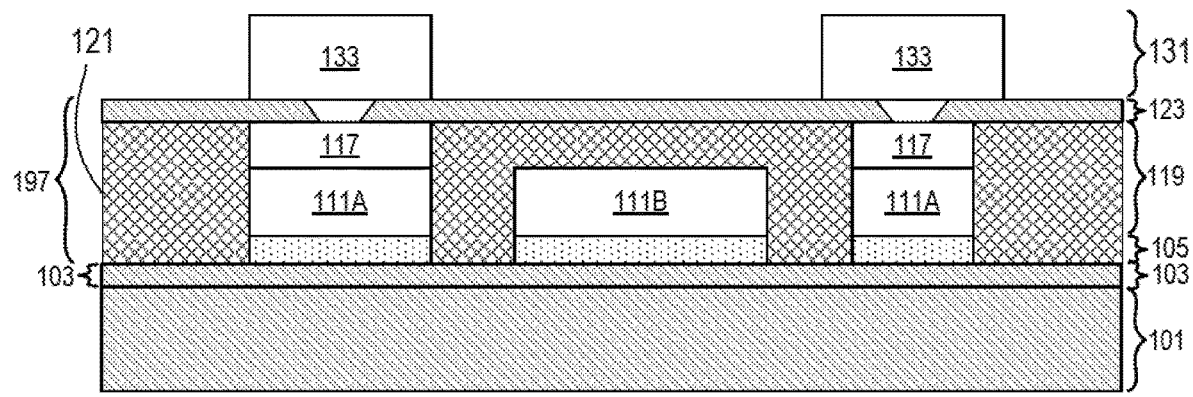
Figure 1P:
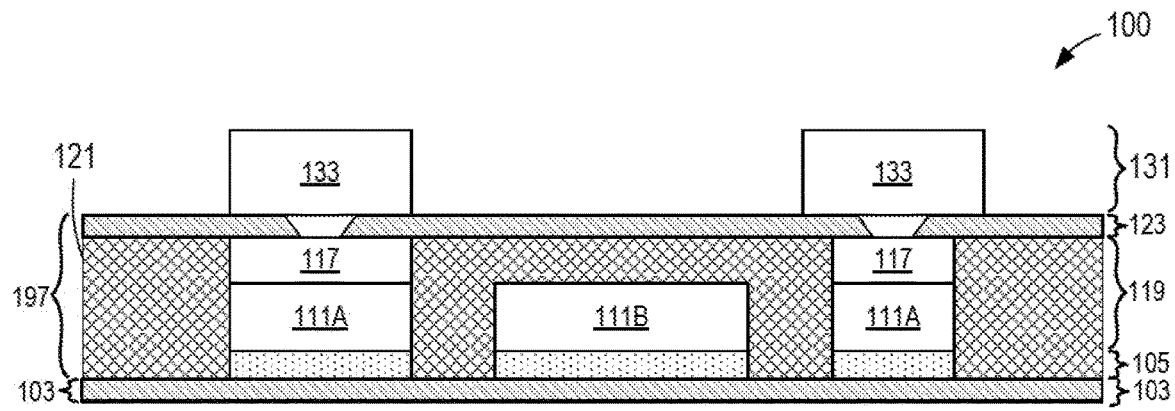
Figure 1Q:
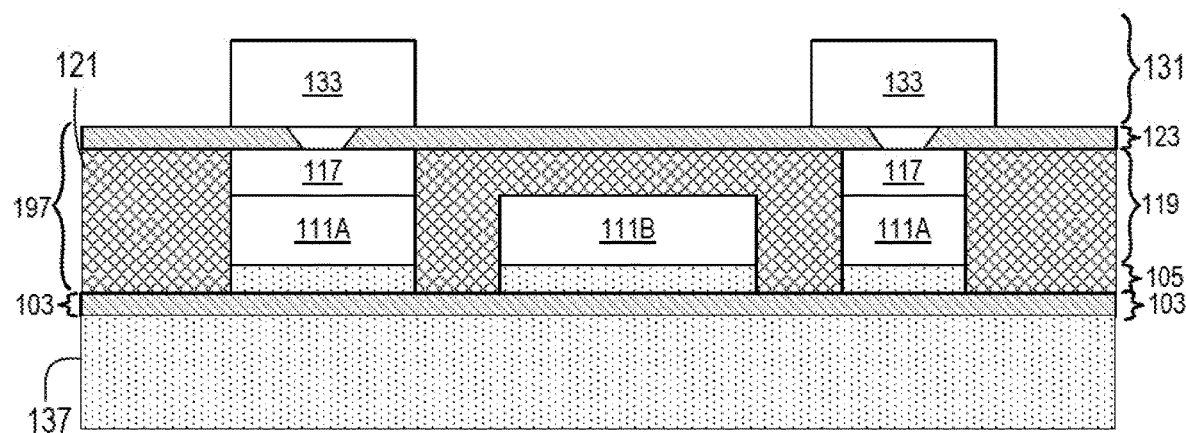
Figure 1R:
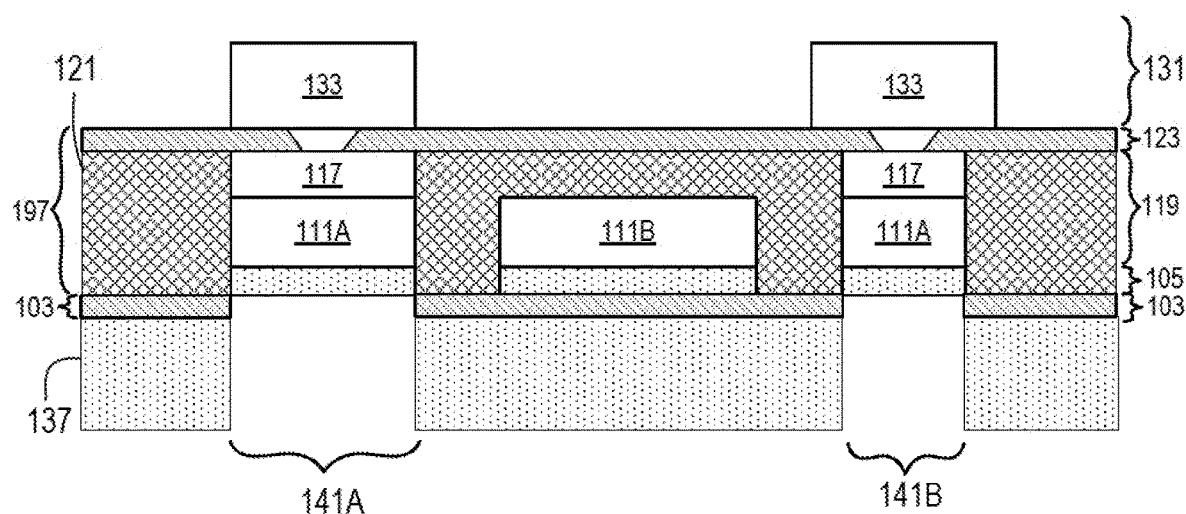
Figure 1S:
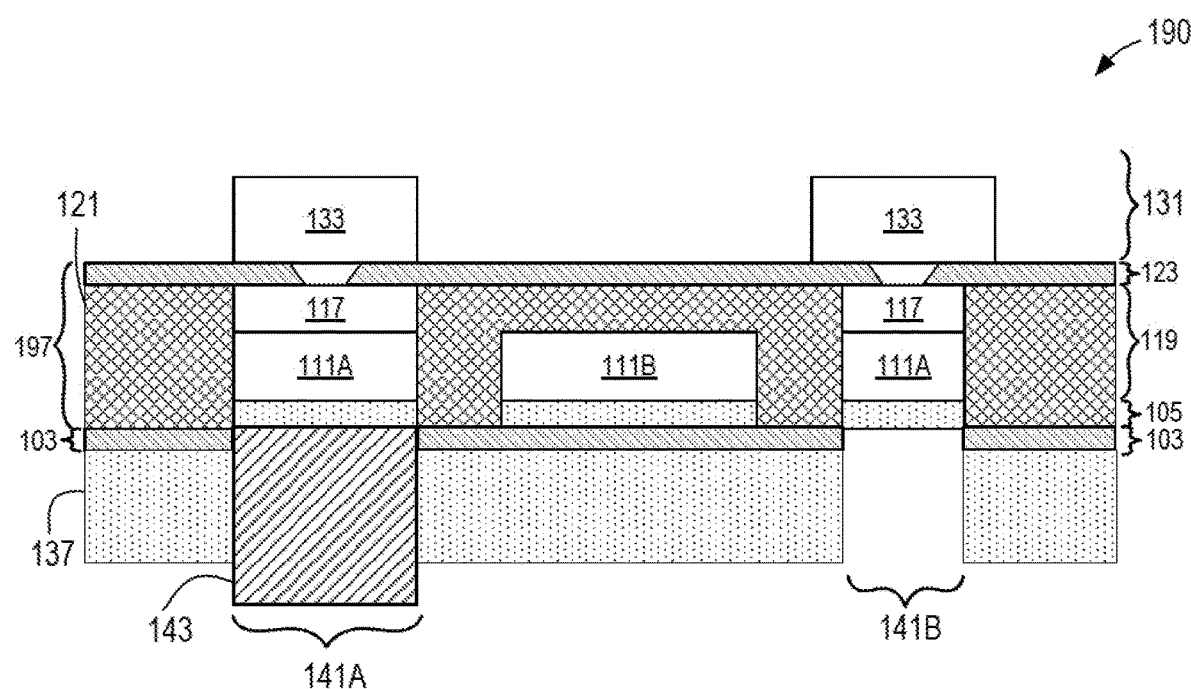

FIGS. 1A-1S are cross-sectional side view illustrations of a method of forming a coreless semiconductor package comprising a magnetic bilayer structure according to one or more embodiments. With regard now to FIG. 1A, a blank panel 101 (which can also be referred to as a detach core 101) is provided. For one embodiment, the blank panel 101 is a peelable or detachable core, and may be constructed with various materials, such as copper (Cu), or one or more other suitable materials, metals, or metal alloys. For example, the blank panel 101 may include several layers of epoxy resin disposed between layers of copper.

The blank panel 101 may be processed or manufactured using semi-additive processing (SAP) technology. The SAP process flow can include pre-treating the blank panel 101. This pre-treatment can include one or more of: (i) a surface roughening process; and (ii) formation of one or more metal layers on the blank panel 101. Surface roughening is known in the art of the semiconductor manufacturing and/or packaging and may include a process of abrading a top surface of cored or coreless substrate (mechanically, chemically, or both) to improve the adhesion of the cored or coreless substrate with subsequently formed layers and structures (e.g., metal layer(s), the blank panel 101, etc.). Surface roughening may be performed on a dielectric layer (e.g., a layer or portion thereof from using an epoxy dielectric material, etc.). Pre-treatment of the cored or coreless substrate may also include forming one or more metal layers after surface roughening is performed. For example, the SAP process flow may include depositing a seed layer on a dielectric layer, depositing a resist layer on the seed layer, using a lithography process to create a patterned resist layer, selectively depositing metal in the patterned resist layer to form a metal layer, and subsequently removing any remaining portions of the resist, seed, and dielectric layers such that only the metal layer remains on the cored or coreless layer. For an embodiment, the metal layer(s) may be formed by a conventional electroplating process. The metal layer(s) may include copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum (Pt), or any combination thereof. For one embodiment, conductive layers include a metal alloy or a compound that includes copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), molybdenum (Mo), palladium (Pd), gold (Au), silver (Au), or platinum (Pt), or any combination thereof. For other embodiments, the metal layer(s) may comprise any suitable material or combination of materials known in the art.

With regard again to FIG. 1A, for some embodiments, one or more layers may be formed on a top surface of the blank panel 101. For example, and shown in FIG. 1A, a top surface of the blank panel 101 may comprise one or more of: (i) at least one build-up layer 103 (e.g., a dielectric layer, a build-up film, etc.), (ii) at least one metal layer (e.g., a seed layer 105, etc.); and (iii) one or more other layers known in the art (e.g., resist layer, interlayer dielectric layer, barrier layer, passivation layer, protection layer, etc.).

For one embodiment, an SAP process flow includes depositing a build-up layer 103 on the blank panel 101. The build-up layer 103 may comprise any suitable material such as, for example, a polymer. One example of a suitable material for the build-up layer 103 is an epoxy dielectric material (e.g., ABF, etc.). The build-up layer 103 can be deposited using one or more suitable dielectric deposition techniques known to one of ordinary skill in the art. For example, the build-up layer 103 can be deposited via one or more lamination techniques known in the art. For one embodiment, the SAP process flow includes processing the build-up layer 103 using one or more surface roughening techniques known in the art. For one embodiment, the build-up layer 103 is laminated on the blank panel 101 such that one or more layers below the build-up layer 103 are electrically isolated from subsequent layers formed on the build-up layer 103.

With regard again to FIG. 1A, for one embodiment, a seed layer 105 is deposited or plated on a top surface of the build-up layer 103. The seed layer 105 can be formed from Cu, Ti, or any other suitable material or combination of materials used to form seed layers as is known in the art. The seed layer 105 can be deposited via any suitable deposition technique, e.g., an electroless plating, sputtering, chemical vapor deposition (CVD), metalorganic chemical vapor deposition (MOCVD), atomic layer deposition (ALD), any other suitable technique of depositing seed layers, a combination thereof.

With regard now to FIG. 1B, for one embodiment, a resist layer 107 is deposited on the seed layer 105. For an embodiment, the resist layer 107 is formed from resist or photoresist material(s). The resist or photoresist material(s) may comprise any suitable dielectric material known in the art (e.g., a dielectric material suitable for processing by etching techniques, etc.). The resist or photoresist material(s) may be in film form, paste form, or liquid form. The resist or photoresist material(s) may comprise positive and/or negative tone dielectric materials.

For one embodiment, the resist layer 107 is patterned using one or more lithography techniques (not shown in FIG. 1B). A lithography technique can include exposing one or more portions of the resist layer 107 to light (e.g., ultra-violet (UV), etc.) via a photomask. The lithography technique form one or more patterns in the resist layer 107. Any lithography technique known in the art can be used.

With regard now to FIG. 1C, the exposed resist layer 107 described above may be processed using a removal technique can include removing, stripping, or etching away the exposed portions of the resist layer 107 to reveal a circuit pattern comprising openings 109. The transferred circuit pattern can include, but is not limited to, a pattern for an inductor that includes one or more pads 111A and one or more conductive lines 111B. Conductive lines 111B may also be referred to as traces 111B in the description below. For one embodiment, the removal technique can be any suitable removal technique known in the art. For example, the removal technique can include chemical etching techniques, etc.

Referring now to FIG. 1D, pads 111A and traces 111B may be formed in the openings 109 of the patterned resist layer 107. In some embodiments, forming pads 111A and traces 111B may include depositing one or more metal layers in the openings 109. For one embodiment, forming pads 111A and traces 111B comprises performing an electrolytic metal plating operation to plate one or more metal layers (e.g., Cu, etc.) onto the top surfaces of the seed layer 105 that are not covered by the resist layer 107 so as to fill the openings 109 that remain after removal of exposed portions of the resist layer 107. As shown in FIG. 1D, each of the pads 111A and traces 111B is separated by two pillars of the unexposed resist layer 107. Top surfaces of the pads 111A and traces 111B may or may not be co-planar with top surfaces of the unexposed portions of the resist layer 107. For one embodiment, the pads 111A and traces 111B have z-heights that are lower than z-heights of the unexposed portions of the resist layer 107. In this way, top surfaces of the pads 111A and traces 111B are not co-planar with top surfaces of the unexposed portions of the resist layer 107. The one or more metal layers used to form pads 111A and traces 111B can be deposited via any suitable deposition technique, e.g., a plating technique, any suitable technique of depositing metal layers, any combination of suitable techniques, etc. The one or more metal layers used to form pads 111A and traces 111B can be formed from Cu, any suitable metal (e.g., a conductive metal, etc.), any suitable metal alloy (e.g., a conductive metal, etc.), and any combination of suitable metals or metal alloys.

With regard now to FIG. 1E, the patterned resist layer 107 may be removed to uncover or reveal one or more portions of the seed layer 105. For one embodiment, no pads 111A and traces 111B are on the uncovered portion(s) of the seed layer 105. This removal operation is performed subsequent to formation of the pads 111A and traces 111B. Unexposed portions of the patterned resist layer 107 may be removed or stripped by conventional techniques, such as by use of one or more resist stripping techniques known in the art, any other suitable technique used for removing resist layers known in the art, and any combination of suitable techniques used for removing resist layers known in the art. As used herein, "an uncovered portion of a layer" and its variations are used to mean that a top surface of the uncovered portion is revealed because no component or layer is on the uncovered portion. As used herein, "a covered portion of a layer" and its variations are used to mean that a top surface of the covered portion is not revealed because one or more components or layers are on the uncovered portion. Side surfaces of a covered portion of a layer may or may not be covered by any component, layer, or material.

With regard now to FIG. 1F, a resist layer 113 can be deposited over surfaces of the unexposed portions of the pads 111A, traces 111B, and the seed layer 105. The resist layer 113 can be similar to or the same as the resist layer 107, which is described above. For one embodiment, the resist layer 113 is patterned using one or more lithography techniques (not shown in FIG. 1F). A lithography technique can include exposing one or more portions of the resist layer 113 to light (e.g., ultra-violet (UV), etc.) via a photomask. The lithography technique may be used to form patterns in the resist layer 113. Any lithography technique known in the art can be used.

Referring now to FIG. 1G, the exposed resist layer 113 described above may be processed using a removal technique can include removing, stripping, or etching away the exposed portions of the resist layer 113 to reveal a pattern comprising openings 115. The pattern can include, but is not limited to, a pattern for one or more pillar structures 117, as described below in connection with FIG. 1H. For one embodiment, the removal technique can be any suitable removal technique known in the art. For example, the removal technique can include chemical etching techniques, etc.

Following removal of exposed portions of the resist layer 113, one or more surfaces of the unexposed portions of the resist layer 113 may or may not be co-planar with one or more surfaces of the unexposed portions of the pads 111A. For a first example, one or more side surfaces of the unexposed portions of the resist layer 113 may or may not be co-planar with one or more side surfaces of the unexposed portions of the pads 111A. For a second example, one or more top surfaces of the unexposed portions of the resist layer 113 may or may not be co-planar with one or more top surfaces of the unexposed portions of the pads 111A.

Referring now to FIG. 1H, pillar structures 117 may be formed in the openings 115 of the patterned resist layer 113 on top surfaces of the pads 111A. In some embodiments, forming the pillar structures 117 may include depositing one or more metal layers in the openings 115 on top surfaces of the pads 111A. For one embodiment, forming the pillar structures 117 comprises performing an electrolytic metal plating operation to plate one or more metal layers (e.g., Cu, etc.) onto the top surfaces of the pads 111A (i.e., the pads 111A, etc.). Top surfaces of the pillar structures 117 may or may not be co-planar with top surfaces of the unexposed portions of the resist layer 107. For one embodiment, the pillar structures 117 have z-heights that are lower than z-heights of the unexposed portions of the resist layer 107. In this way, top surfaces of the pillar structures 117 are not co-planar with top surfaces of the unexposed portions of the resist layer 107. Furthermore, top surfaces of the pillar structures 117 may or may not be co-planar with top surfaces of the unexposed portions of the resist layer 113. For one embodiment, the pillar structures 117 have z-heights that are lower than z-heights of the unexposed portions of the resist layer 113. In this way, top surfaces of the pillar structures 117 are not co-planar with top surfaces of the unexposed portions of the resist layer 107.

For an embodiment, and as shown in FIG. 1H, a pillar structure 117 is fabricated on each pad 111A. For a further embodiment, a pillar structure 117 is fabricated on each pad 111A and not on any of the conductive lines 111B. Each combination of a pillar structure 117 and a pad 111A may be referred to herein as a raised pad structure 119, as shown in FIG. 1H. Consequently, and for one embodiment, each raised pad structure 119 has an increased thickness (e.g., z-height, etc.) that is larger than the thicknesses (e.g., z-heights, etc.) of the other inductor features 111B (e.g., conductive lines 111B, etc.). For one embodiment, each pillar structure 117 is formed on a pad 111A using one or more of the techniques described in one or more of: (i) U.S. Pat. No. 5,888,897 by Chunlin Liang (and/or at least one of its counterpart applications or patents); and (ii) U.S. Pat. No. 9,713,264 by Brandon M. Rawlings et al. (and/or at least one of its counterpart applications or patents). For one embodiment, there is little to no misalignment between a pillar structure 117 and the respective pad 111A on which the pillar structure 117 is fabricated. This misalignment may be measured in terms of dimensions as defined by a coordinate system. For example, misalignment may be measured in terms of dimensions as defined by the x-direction, y-direction, and/or z-direction. For one embodiment, dimensions of the pillar structure 117 and the respective pad 111A are at least approximately similar in all directions other than the direction of the other inductor features 111B (e.g., conductive lines 111B, etc.). Consequently, a raised pad structure 119 is advantageously achieved.

For one embodiment, a size (e.g., width, length, etc.) of the pad 111A is approximately the same as a corresponding size (e.g., width, length, etc.) of the pillar structure 117. In this way, the pad 111A and the pillar structure 117 are aligned or minimally misaligned relative to each other. For this embodiment, one or more surfaces of the pillar structure 117 may be co-planar or substantially co-planar with one or more surfaces of the pad 111A. For example, one or more side surfaces of the pillar structure 117 are co-planar or substantially co-planar with one or more side surfaces of the pad 111A. For a further example, each side surface of the pillar structure 117 is co-planar or substantially co-planar with a corresponding side surface of the pad 111A.

For another embodiment, a size (e.g., width, length, etc.) of the pillar structure 117 is less than or equal to a corresponding size (e.g., width, length, etc.) of pad 111A. In this way, the pad 111A and the pillar structure 117 are aligned or minimally misaligned relative to each other. For this embodiment, one or more surfaces of the pillar structure 117 may be co-planar or substantially co-planar with one or more surfaces of the pad 111A. For example, one or more side surfaces of the pillar structure 117 are co-planar or substantially co-planar with one or more side surfaces of the pad 111A. For a further example, only one side surface of the pillar structure 117 is co-planar or substantially co-planar with a corresponding side surface of the pad 111A.

For yet another embodiment, and as shown in FIG. 1H, a size (e.g., width, length, etc.) of the pillar structure 117 is less than a corresponding size (e.g., width, length, etc.) of pad 111A. In this way, the pillar structure 117 is formed on the pad 111A, even though the pillar structure 117 and the pad 111A are misaligned relative to each other. For this embodiment, one or more surfaces of the pillar structure 117 may not be co-planar or substantially co-planar with one or more surfaces of the pad 111A. For example, one or more side surfaces of the pillar structure 117 are not co-planar or substantially co-planar with one or more side surfaces of the pad 111A. For a further example, each side surface of the pillar structure 117 is not co-planar or substantially co-planar with a corresponding side surface of the pad 111A.

With regard now to FIG. 1I, the patterned resist layer 113 may be removed to uncover or reveal one or more portions of the seed layer 105. For one embodiment, no pads 111A and traces 111B are on the uncovered portion(s) of the seed layer 105. This removal operation is performed subsequent to formation of the pads 111A, traces 111B, and pillar structures 117. Unexposed portions of the patterned resist layer 113 may be removed or stripped by conventional techniques, such as by use of one or more resist stripping techniques known in the art, any other suitable technique used for removing resist layers known in the art, and any combination of suitable techniques used for removing resist layers known in the art.

Referring now to FIG. 1J, the uncovered portion(s) of the seed layer 105 may be removed to uncover or reveal one or more portions of the build-up layer 103. For one embodiment, no portion of the seed layer 105 is on the uncovered portion(s) of the build-up layer 103. This removal operation is performed subsequent to removal of the patterned resist layer 113. The uncovered portion(s) of the seed layer 105 may be removed by conventional techniques, such as by use of one or more etching techniques known in the art, any other suitable technique used for removing seed layers known in the art, and any combination of suitable techniques used for removing seed layers known in the art.

Moving on to FIG. 1K, a magnetic layer 121 is deposited or applied on the raised pad structures 119 (i.e., the pads 111A and the corresponding pillar structures 117 on the pads 111A), the other inductor features 111B (e.g., conductive lines 111B, etc.), unremoved portions of the seed layer 105, and uncovered portions of the build-up layer 103. For one embodiment, the magnetic layer 121 is a magnetic film that is applied via one or more lamination techniques known in the art. Magnetic films are described above.

Referring now to FIG. 1L, one or more planarization techniques may be used to make top surfaces of the raised pad structures 119 and the magnetic layer 121 co-planar (or substantially co-planar) with each other. For one embodiment, any known planarization technique may be used. Examples of planarization techniques include, but are not limited to, mechanical planarization techniques (e.g., grinding, polishing, etc.), chemical planarization techniques, and any combination thereof. For an embodiment, one or more mechanical planarization techniques may be used.

With regard now to FIG. 1M, a dielectric layer 123 may be deposited on, applied to, or formed on the co-planar (or substantially co-planar) top surfaces of the raised pad structures 119 and magnetic layer 121. For one embodiment, the dielectric layer 123 comprises a dielectric film. Dielectric films are described above. For one embodiment, the dielectric layer 123 may comprise any suitable material or combination of materials (e.g., an epoxy dielectric material, any suitable dielectric material, any combination thereof, etc.). For a specific example, the dielectric layer 123 comprise any suitable dielectric material known in the art (e.g., a dielectric material suitable for processing by laser drilling and/or ablation techniques, a dielectric material suitable for processing by etching techniques, etc.). For one embodiment, the dielectric layer 123 and the magnetic layer 121 collectively form a magnetic bilayer structure 197.

Moving on to FIG. 1N, vias 125 may be formed on the magnetic bilayer structure 197 by removing portions of the dielectric layer 123 above the raised pad structures 119. Removing portions of the dielectric layer 123 above the raised pad structures 119 can be performed by laser drilling, laser ablation, chemical etching techniques, lithography techniques, any suitable removal technique, and any combination of suitable techniques known in the art of semiconductor fabrication.

For one or more embodiments, a size 127 of a via 125 is less than or equal to a corresponding size 129 of a raised pad structure 119. In this way, the vias 125 are formed exclusively on the top surfaces of the raised pad structures 119 without being formed on the magnetic layer 121. For one embodiment, a size 127 (e.g., a width, a length, etc.) of a via 125 is less than or equal to a corresponding size 129 (e.g., a width, a length, etc.) of a top surface of the raised pad structures 119. For one embodiment, a size 127 of a via 125 is approximately equal to a corresponding size 129 of a raised pad structure 119 such that the via 125 and the raised pad structure 119 are aligned or minimally misaligned relative to each other. For one embodiment, a size 127 of a via 125 is less than a corresponding size 129 of a raised pad structure 119 such that the via 125 is formed on the raised pad structure 119 even though the via 125 and the raised pad structured 119 may be misaligned relative to each other.

Vias 125 may be formed using any suitable technique known in the art (e.g., wet or dry etching, lift-off, laser drilling, laser ablation, lithography techniques that are followed by removal techniques, any other suitable technique, any combination of suitable techniques, etc.). Techniques used to form the vias 125 are a design choice that is dependent on the materials that make up the dielectric layer 123. For one example, where the dielectric layer 123 is formed from a dielectric material (e.g., an epoxy dielectric material, etc.), laser drilling techniques, laser ablation techniques, desmearing techniques, and/or any other suitable techniques known in the art may be used to remove one or more portions of the dielectric layer 123 to create cavities in the dielectric layer 123 above the raised pad structures 119. The cavities in the dielectric layer 123 reveal top surfaces of the raised pad structures 119. In this way, the vias 125 are formed. For a further version of this example, the vias 125 may be formed after a suitable metal or metal alloy (e.g., Cu, etc.) is deposited using any suitable deposition technique (e.g., plating, sputter seed deposition, etc.) into the cavities. For an even further version of this example, a seed layer may be deposited in the cavities after top surfaces of raised pad structures 119 are revealed and prior to deposition of the metal or metal alloy in the cavities to form the vias 125.

As shown by the immediately preceding examples, vias 125 may be formed using one or more suitable techniques. At least one of the vias 125 shown in FIG. 1N has a tapered shape; however, at least one of the vias 125 may have another shape (e.g., a non-tapered shape, etc.).

Moving now to FIG. 1O, one or more layer(s) 131 may be formed after vias 125 are formed. The layer(s) 131 may include any suitable layers (e.g., seed layer, resist layer, passivation layer, etc.). As shown in FIG. 1O, conductive structures 133 are formed over the vias 125 for coupling the raised pad structures 119 to the layer(s) 131. The conductive structures 133 may be formed using any suitable technique(s). For one example, formation of conductive structures 133 may include one or more of the following operations: (i) depositing a seed layer on top surfaces of the dielectric layer 123 and the raised pad structures 119; (i) depositing a resist layer on the seed layer; (ii) patterning the resist layer by exposing one or more portions of the resist layer using one or more lithography techniques; (iii) removing any unexposed portion(s) of the resist layer to create openings above the vias 125 in the remaining portion(s) of the resist layer; and (iv) plating one or more conductive materials (e.g., metal, metal alloy, etc.) into the openings above the vias 125. For an alternate example, the seed layer is deposited in the openings above the vias 125 prior to plating one or more metal layers into the openings above the vias 125. In the illustrated embodiment shown in FIG. 1O the conductive structures 133 are shown as pillars. Other embodiments, however, are not so limited. The structures 133 may have any shape and/or size (e.g., z-height, etc.). For one example, the structures 133 may be pads.

Moving on FIG. 1P, the blank panel 101 may be removed or peeled off the build-up layer 103. For one example, the blank panel 101 is removed by cutting or otherwise severing the lateral ends of blank panel 750 and separating the outermost metal layers from the next adjacent metal layers, leaving the next adjacent metal layers attached to the epoxy resin core. The outermost metal layers of the blank panel 101 may remain attached to the build-up layer 103. The outermost metal layers of the blank panel 101 may be removed from the build-up layer 103 by an etching process. First, one or more metal layers of the blank panel 101 may be removed using the same or similar etching process. In some embodiments, a first metal layer of the blank panel 101 may be a layer of copper, the second metal layer of the blank panel 101 may be a layer of gold, and the first metal layer may be removed to expose the surface of second metal layer. For brevity, and as shown, in FIG. 1P, the entire blank panel 101 is removed. Other embodiments are not so limited. For example, one or more layers of the blank panel 101 may be left attached to the build-up layer 103.

After the operations shown in FIG. 1P are performed, a coreless semiconductor package portion 100 comprising a magnetic bilayer structure 197 is formed. The semiconductor package portion 100 may be subjected additional operations/processes (not shown in FIGS. 1A-1O) in order to fabricate a complete semiconductor package. These additional operations/processes include one or more current semiconductor fabrication processes that comply with current industry standards. Examples include, but are not limited to, desmearing processes, electroless plating processes, seed etching processes, and processes involving roughening baths. For one embodiment, a complete semiconductor package may comprise one or more portions 100.

For one embodiment, the semiconductor package portion 100 is not affected (or not as affected) by one or more of the drawbacks associated with some proposed ACIs having magnetic materials. For a first example, any additional operation(s) in compliance with current industry standards may be performed on the semiconductor package portion 100 without requiring costly tailoring of the magnetic layer 121. This is at least because the magnetic bilayer structure 197, the vias 125, and the raised pad structures 119 isolate the pads 111A, traces 111B and the magnetic layer 121 from interacting with bath chemistries, materials, and/or tools used in the additional operation(s). For a second example, there is a minimized risk of contaminating bath chemistries, materials, and/or tools used in the additional operation(s) performed on the semiconductor package portion 100. This is also at least because the magnetic bilayer structure 197, the vias 125, and the raised pad structures 119 isolate the pads 111A, traces 111B, and the magnetic layer 121 from interacting with bath chemistries, materials, and/or tools used in the additional operation(s). For a third example, there is a minimized risk of having dirty vias in the semiconductor package portion 100. This is because the vias 125 are fabricated through the magnetic bilayer structure 197 directly above the raised pad structures 119 (and not through the magnetic bilayer structure 197 directly above the magnetic layer 121, the pads 111A, and/or the traces 111B). That is, any techniques used for forming the vias 125 (e.g., laser drilling, laser ablation, any other suitable technique known in the art, any combination thereof, etc.) is not applied to or used to contaminate the magnetic layer 121, the pads 111A, and/or the traces 111B.

Referring now to FIGS. 1Q-1S, which illustrate one or more exemplary additional operations/processes that may be performed after the coreless semiconductor package portion 100 is formed. With specific regard to FIG. 1Q, after the coreless semiconductor package portion 100 is formed, a solder resist composition 137 is formed or deposited on a surface of the build-up layer 103. For one embodiment, forming or depositing the solder resist composition 137 is performed by laminating the solder resist composition 137 on an uncovered bottom surface of the build-up layer 103.

Moving on to FIG. 1R, one or more portions of the solder resist composition 137 and one or more portions of the build-up layer 103 may be removed or etched away using one or more suitable techniques that create openings 141A-B. For one embodiment, the openings 141A-B are designed such that surfaces of the seed layer 105 are partially or completely uncovered. Techniques used to create the openings 141A-B include laser drilling, laser ablation, etching, chemical stripping, lithography, any other suitable technique, and any combination of suitable techniques known in the art.

Referring now to FIG. 1S, a magnetic material 143 may be deposited or applied into one or more of the openings 141A-B. For a non-limiting example, and as shown in FIG. 1S, a magnetic material 143 is deposited into the openings 141A. The magnetic material 143 comprises one or more of magnetic ink or a magnetic paste. Any suitable technique for depositing a magnetic ink or magnetic paste known in the art may be used to deposit the magnetic material 143 in one or more of the openings 141A-B. Furthermore, a bottom surface of the magnetic material 143 may or may not be co-planar with bottom sides of the solder resist composition 137. For one embodiment, a bottom side of the magnetic material 143 is not co-planar with bottom sides of the solder resist composition 137. For another embodiment, a bottom side of the magnetic material 143 is co-planar or substantially co-planar with bottom sides of the solder resist composition 137.

After the operations described in connection with FIG. 1S are performed, a coreless semiconductor package portion 190 comprising the magnetic bilayer structure 197 and a magnetic material 143 is formed. The semiconductor package portion 190 may be subjected additional operations/processes (not shown in FIGS. 1A-1R) in order to fabricate a complete semiconductor package. One or more of these additional operations/processes are described above in connection with at least FIGS. 1A-1R. For one embodiment, a complete semiconductor package may comprise one or more portions 190. Furthermore, the semiconductor package portion 190 has similar or the same advantages as the advantages described above in connection with the semiconductor package portion 100.

Various operations are described in connection with FIGS. 1A-1S (and with one or more of the FIGS. 2A-7 described below) as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

FIGS. 2A-2H are cross-sectional side view illustrations of a method of forming a coreless semiconductor package comprising a magnetic bilayer structure according to one or more embodiments. The method shown in FIGS. 2A-2H omits one or more processes, operations, and/or steps known in the art of semiconductor manufacturing and/or packaging for simplicity and to avoid obscuring or convoluting one or more of the inventive concepts described herein.

Figure 2A:
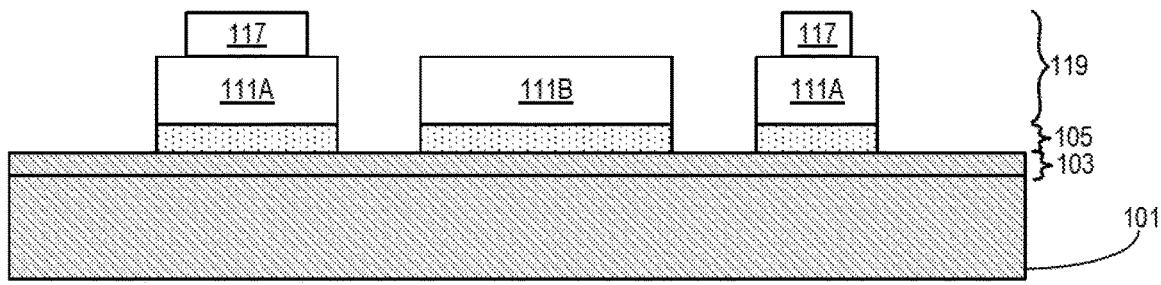
FIGS. 2A-2H are cross-sectional side view illustrations of a method of forming a coreless semiconductor package having one or more magnetic bilayer structures embedded therein according to one embodiment.

FIG. 2A illustrates a semiconductor package portion that is formed after the operations described above in connection with FIGS. 1A-1J are performed. With specific regard now to FIG. 2A, uncovered portion(s) of the seed layer 105 may be removed to uncover or reveal one or more portions of the build-up layer 103. For one embodiment, no portion of the seed layer 105 is on the uncovered portion(s) of the build-up layer 103. This removal operation is performed subsequent to removal of the patterned resist layer 113. The uncovered portion(s) of the seed layer 105 may be removed by conventional techniques, such as by use of one or more etching techniques known in the art, any other suitable technique used for removing seed layers known in the art, and any combination of suitable techniques used for removing seed layers known in the art.

Figure 2B:
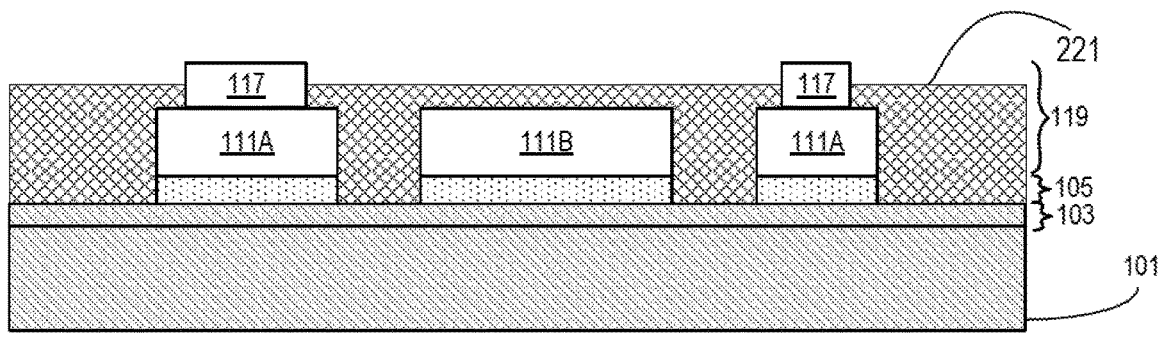

Referring now to FIG. 2B, a magnetic layer 221 is used to encapsulate the raised pad structures 119 (i.e., the pads 111A and the corresponding pillar structures 117 on the pads 111A), the other inductor features 111B (e.g., conductive lines 111B, etc.), uncovered portions of the seed layer 105, and uncovered portions of the build-up layer 103.

For one embodiment, the magnetic layer 221 comprises a magnetic ink that is deposited, printed, or applied using one or more suitable techniques known in the art. Magnetic inks are described above. For one embodiment, when the magnetic layer 221 comprises a magnetic ink, the material 221 is deposited, printed, or applied until top surfaces of the raised pad structures 119 and the magnetic layer 221 are not co-planar (or substantially co-planar) with each other. For one embodiment, when the magnetic layer 221 comprises a magnetic ink, the material 221 is deposited, printed, or applied until only some portions of the raised pad structures 119 are encapsulated by the magnetic layer 221. For this embodiment, an uncovered portion of a raised pad structure 119 includes: (i) a top surface of the raised pad structure 119; and (i) portions of side surfaces of the raised pad structure 119.

For one embodiment, the magnetic layer 221 comprises a magnetic paste that is deposited or applied using one or more suitable techniques known in the art. Magnetic pastes are described above. For one embodiment, when the magnetic layer 221 comprises a magnetic paste, the material 221 is deposited or applied until top surfaces of the raised pad structures 119 and the magnetic layer 221 are not co-planar (or substantially co-planar) with each other. For one embodiment, when the magnetic layer 221 comprises a magnetic paste, the material 221 is deposited or applied until only some portions of the raised pad structures 119 are encapsulated by the magnetic layer 221. For this embodiment, an uncovered portion of a raised pad structure 119 includes: (i) a top surface of the raised pad structure 119; and (i) portions of side surfaces of the raised pad structure 119.

For one embodiment, the magnetic layer 221 comprises a magnetic film. When the magnetic layer 221 comprises a magnetic film, the magnetic film is used to encapsulate the raised pad structures 119 (i.e., the pads 111A and the corresponding pillar structures 117 on the pads 111A), the other inductor features 111B (e.g., conductive lines 111B, etc.), uncovered portions of the seed layer 105, and uncovered portions of the build-up layer 103. For one embodiment, when the magnetic layer 221 comprises a magnetic film, the magnetic film is applied using one or more lamination techniques known in the art. Magnetic films are described above. For one embodiment, when the magnetic layer 221 is a magnetic film, the material 221 is deposited, laminated, or applied until only some portions of the raised pad structures 119 are encapsulated by the magnetic film 221. For this embodiment, an uncovered portion of a raised pad structure 119 includes: (i) a top surface of the raised pad structure 119; and (i) portions of side surfaces of the raised pad structure 119. For another embodiment, when the magnetic layer 221 is a magnetic film, one or more planarization techniques may be applied to the magnetic film 221 until top surfaces of the raised pad structures 119 and the magnetic film 221 are not co-planar (or substantially co-planar) with each other. For one embodiment, the planarization technique(s) are applied to the magnetic layer 221, which comprises a magnetic film, until only some portions of the raised pad structures 119 are encapsulated by the magnetic material 221. For this embodiment, an uncovered portion of a raised pad structure 119 includes: (i) a top surface of the raised pad structure 119; and (i) portions of side surfaces of the raised pad structure 119. For one embodiment, any known planarization technique may be used. Examples of planarization techniques include, but are not limited to, mechanical planarization techniques (e.g., grinding, polishing, etc.), chemical planarization techniques, and any combination thereof. For an embodiment, one or more mechanical planarization techniques may be used.

Figure 2C:
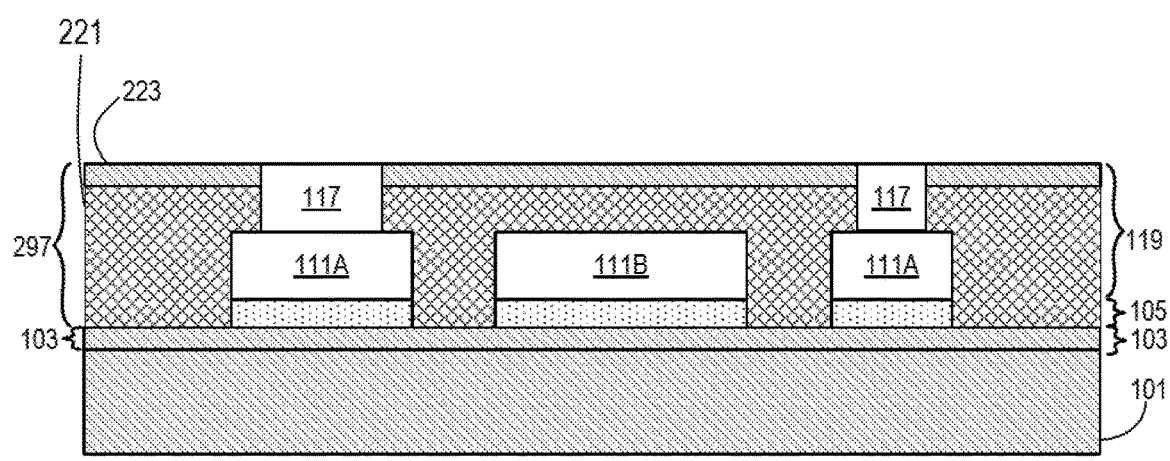

With regard now to FIG. 2C, a dielectric layer 223 may be deposited on, applied to, or formed on uncovered top surfaces of magnetic layer 221 such that uncovered top surfaces of the raised pad structures 119 remain uncovered and uncovered side surfaces of the raised pad structures 119 are covered by the dielectric layer 223. For one embodiment, the dielectric layer 223 may be deposited on, applied to, or formed on uncovered top surfaces of magnetic layer 221, uncovered top surfaces of the raised pad structures 119, and uncovered side surfaces of the raised pad structures 119. For this embodiment, one or more portions of the dielectric layer 223 may be removed until top surfaces of the raised pad structures 119 are uncovered or revealed. Any suitable removal technique can be used for removing the portion(s) of the dielectric layer 223 (e.g., laser drilling and/or ablation techniques, etching techniques, etc.). For one embodiment, the dielectric layer 223 comprises a dielectric film. Dielectric films are described above. For one embodiment, the dielectric layer 223 may comprise any suitable material or combination of materials (e.g., an epoxy dielectric material, any suitable dielectric material, any combination thereof, etc.). For a specific example, the dielectric layer 223 comprises any suitable dielectric material known in the art (e.g., a dielectric material suitable for processing by laser drilling and/or ablation techniques, a dielectric material suitable for processing by etching techniques, etc.). For one embodiment, a magnetic bilayer structure 297 comprises the dielectric layer 223 and the magnetic layer 221.

Figure 2D:
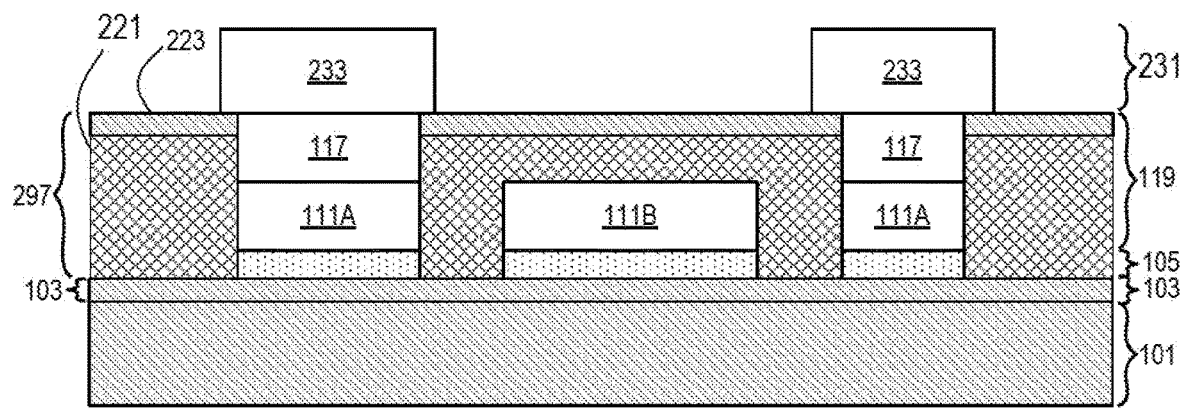

Moving now to FIG. 2D, one or more layer(s) 231 may be formed after the dielectric layer 223 is formed. The layer(s) 231 may include any suitable layers (e.g., seed layer, resist layer, passivation layer, etc.). As shown in FIG. 2D, conductive structures 233 are formed over top surfaces of the raised pad structures 119. In this way, the structures 233 assist with coupling the raised pad structures 119 to the layer(s) 231. The conductive structures 233 may be formed using any suitable technique(s). For one example, formation of conductive structures 233 may include one or more of the following operations: (i) depositing a seed layer on top surfaces of the dielectric layer 223 and the raised pad structures 119; (i) depositing a resist layer on the seed layer; (ii) patterning the resist layer by exposing one or more portions of the resist layer using one or more lithography techniques; (iii) removing any unexposed portion(s) of the resist layer to create openings above the top surfaces of the raised pad structures 119 in the remaining portion(s) of the resist layer; and (iv) plating one or more conductive materials (e.g., metal, metal alloy, etc.) into the openings above the top surfaces of the raised pad structures 119. In the illustrated embodiment shown in FIG. 2D, the conductive structures 233 are shown as pillars. Other embodiments, however, are not so limited. The structures 233 may have any shape and/or size (e.g., z-height, etc.). For example, the structures 233 may be pads, traces, etc.

Figure 2E:
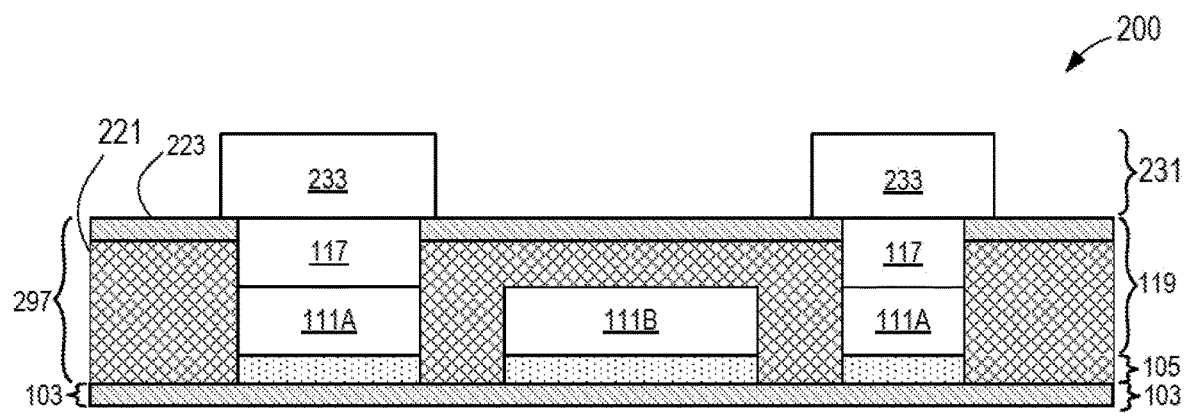

Moving on FIG. 2E, the blank panel 101 may be removed or peeled off the build-up layer 103. Removing the blank panel 101 is described above in connection with at least FIG. 1P.

After the operations shown in FIG. 2E are performed, a coreless semiconductor package portion 200 comprising the magnetic bilayer structure 297 is formed. The semiconductor package portion 200 may be subjected additional operations/processes (not shown in FIGS. 2A-2E) in order to fabricate a complete semiconductor package. These additional operations/processes include one or more current semiconductor fabrication processes that comply with current industry standards. Examples include, but are not limited to, desmearing processes, electroless plating processes, seed etching processes, and processes involving roughening baths. For one embodiment, a complete semiconductor package may comprise one or more portions 200. For one embodiment, the semiconductor package portion 200 has advantages that are similar to or the same as the advantages described above in connection the portion 100.

Figure 2F:
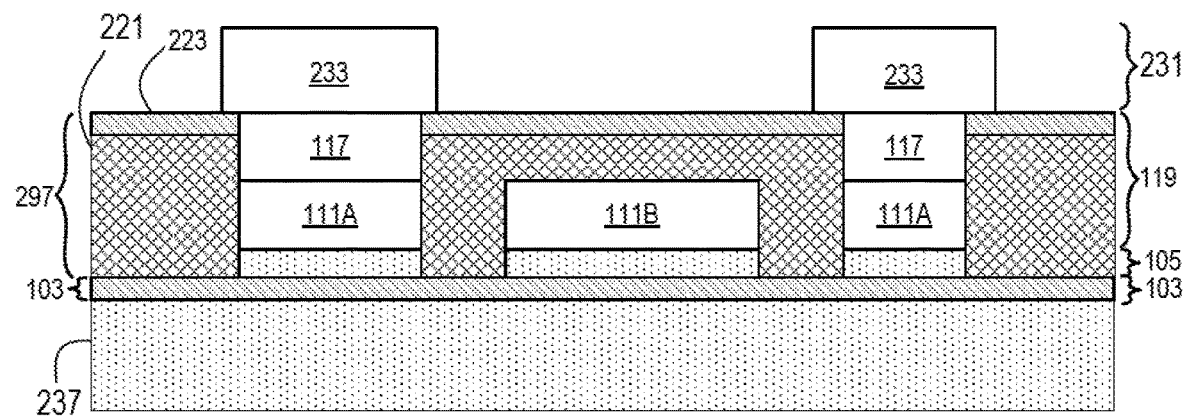
Figure 2G:
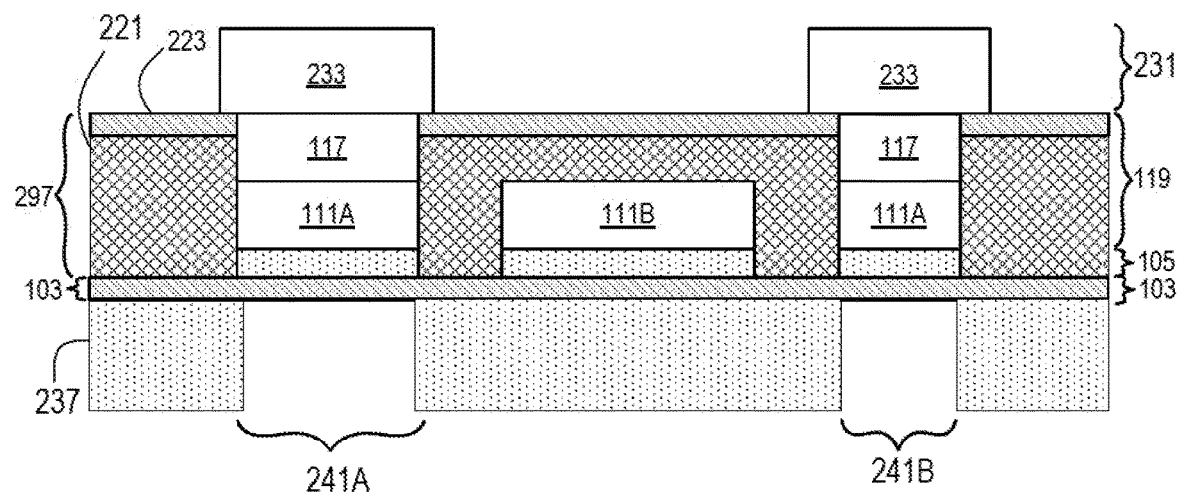
Figure 2H:
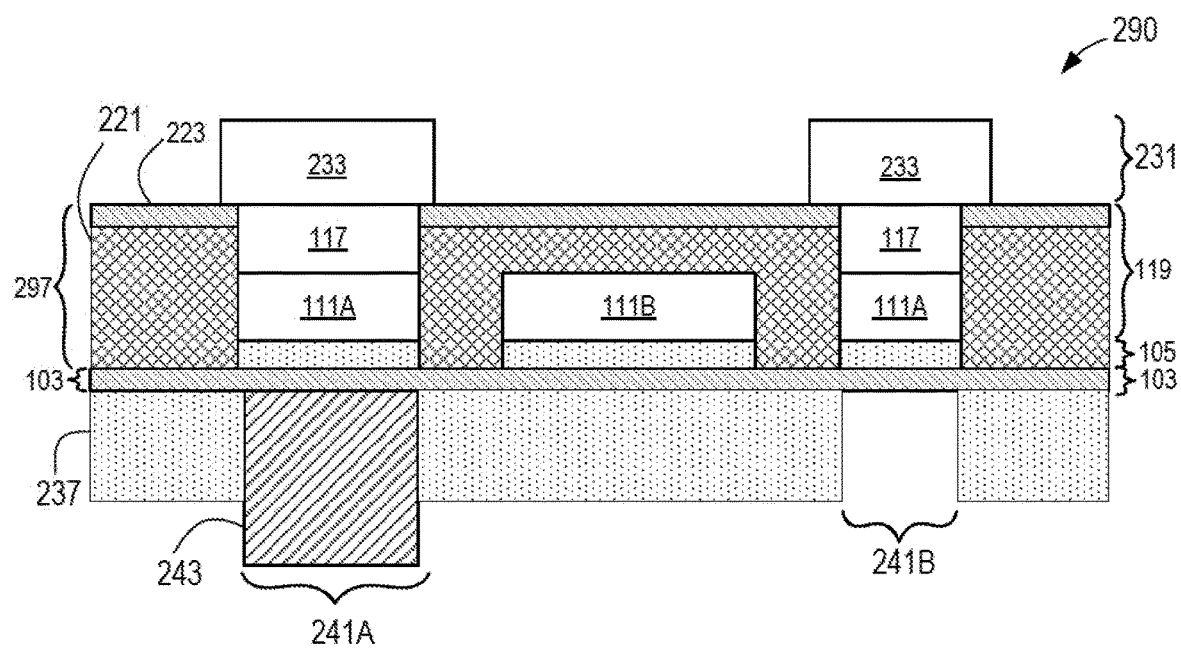

Referring now to FIGS. 2F-2H, which illustrate one or more exemplary additional operations/processes that may be performed after the coreless semiconductor package portion 200 is formed. With specific regard to FIG. 2F, after the coreless semiconductor package portion 200 is formed, a solder resist composition 237 is formed or deposited on a surface of the build-up layer 103. For one embodiment, forming or depositing the solder resist composition 237 is performed by laminating the solder resist composition 237 on an uncovered bottom surface of the build-up layer 103.

Moving on to FIG. 2G, one or more portions of the solder resist composition 237 and one or more portions of the build-up layer 103 may be removed or etched away using one or more suitable techniques that create openings 241A-B. For one embodiment, the openings 241A-B are designed such that surfaces of the seed layer 105 are partially or completely uncovered. Techniques used to create the openings 241A-B include laser drilling, laser ablation, etching, chemical stripping, lithography, any other suitable technique, and any combination of suitable techniques known in the art.

Referring now to FIG. 2H, a magnetic material 243 may be deposited or applied into one or more of the openings 241A-B. For a non-limiting example, and as shown in FIG. 2H, a magnetic material 243 is deposited into the openings 241A. The magnetic material 243 is similar to or the same as the magnetic material 143 described above in connection with at least FIG. 1S. Any suitable technique for depositing a magnetic ink or paste known in the art may be used to deposit the magnetic material 243 in one or more of the openings 241A-B. Furthermore, a bottom surface of the magnetic material 243 may or may not be co-planar with bottom sides of the solder resist composition 237. For one embodiment, a bottom side of the magnetic material 243 is not co-planar with bottom sides of the solder resist composition 237. For another embodiment, a bottom side of the magnetic material 243 is co-planar or substantially co-planar with bottom sides of the solder resist composition 237.

After the operations described in connection with FIG. 2H are performed, a coreless semiconductor package portion 290 comprising a magnetic bilayer structure 297 and a magnetic material 243 is formed. The semiconductor package portion 290 may be subjected additional operations/processes (not shown in FIGS. 2A-2H) in order to fabricate a complete semiconductor package. One or more of these additional operations/processes are described above in connection with at least FIGS. 1A-1S. For one embodiment, a complete semiconductor package may comprise one or more portions 290. Furthermore, the semiconductor package portion 290 has advantages that are similar to or the same as the advantages described above in connection with the semiconductor package portion 100.

FIGS. 3A-3H are cross-sectional side view illustrations of a method of forming a coreless semiconductor package comprising a magnetic bilayer structure according to one or more embodiments. The method shown in FIGS. 3A-3H omits one or more processes, operations, and/or steps known in the art of semiconductor manufacturing and/or packaging for simplicity and to avoid obscuring or convoluting one or more of the inventive concepts described herein.

Figure 3A:
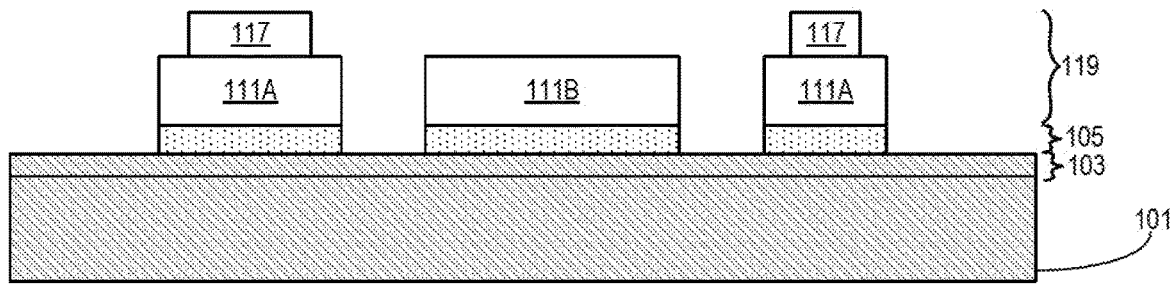
FIGS. 3A-3H are cross-sectional side view illustrations of a method of forming a coreless semiconductor package having one or more magnetic bilayer structures embedded therein according to one embodiment.

FIG. 3A illustrates a semiconductor package portion that is formed after the operations described above in connection with FIGS. 1A-1J are performed. With specific regard now to FIG. 3A, uncovered portion(s) of the seed layer 105 may be removed to uncover or reveal one or more portions of the build-up layer 103. For one embodiment, no portion of the seed layer 105 is on the uncovered portion(s) of the build-up layer 103. This removal operation is performed subsequent to removal of the patterned resist layer 113. The uncovered portion(s) of the seed layer 105 may be removed by conventional techniques, such as by use of one or more etching techniques known in the art, any other suitable technique used for removing seed layers known in the art, and any combination of suitable techniques used for removing seed layers known in the art.

Figure 3B:
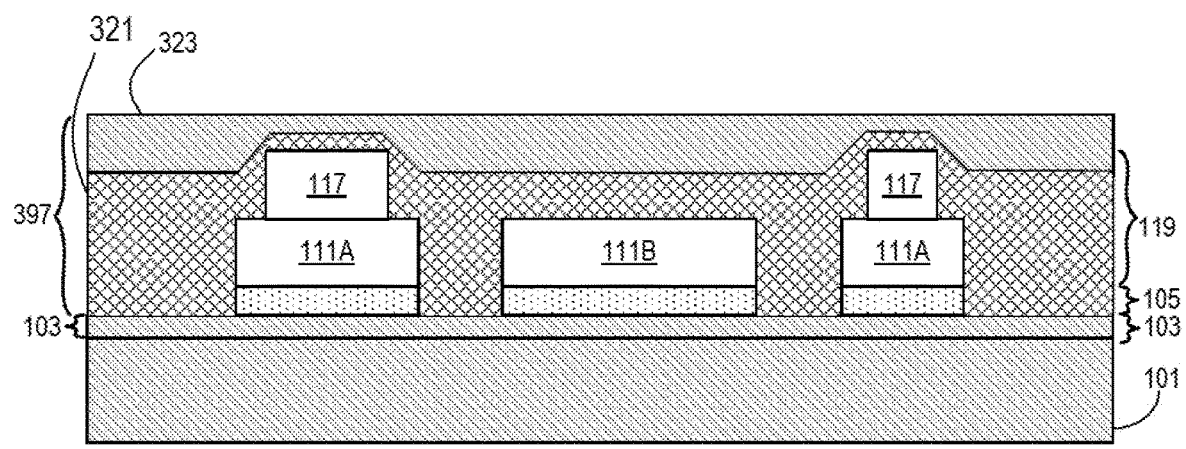

Referring now to FIG. 3B, a magnetic bilayer structure 397 is used to encapsulate the raised pad structures 119 (i.e., the pads 111A and the corresponding pillar structures 117 on the pads 111A), the other inductor features 111B (e.g., conductive lines 111B, etc.), uncovered portions of the seed layer 105, and uncovered portions of the build-up layer 103. For one embodiment, the magnetic bilayer structure 397 comprises a magnetic layer 321 and a dielectric layer 323. For a specific embodiment, the magnetic bilayer structure 397 is a prepackaged structure comprising the dielectric layer 323 on the magnetic layer 321. For a specific embodiment, the magnetic bilayer structure 397 is a prepackaged structure comprising the dielectric layer 323 as a dielectric film that is laminated on the magnetic layer 321. For this specific embodiment, the magnetic layer 321 is a magnetic film.

For one embodiment, the magnetic layer 321 is a magnetic film. When the magnetic material is magnetic film 321, the magnetic film is used to encapsulate the raised pad structures 119 (i.e., the pads 111A and the corresponding pillar structures 117 on the pads 111A), the other inductor features 111B (e.g., conductive lines 111B, etc.), uncovered portions of the seed layer 105, and uncovered portions of the build-up layer 103. For one embodiment, the magnetic film 321 is applied using one or more lamination techniques known in the art. Magnetic films are described above. For one embodiment, when the magnetic material is a magnetic film, the material 321 is deposited, laminated, or applied until all portions of the raised pad structures 119 are encapsulated by the magnetic film 321.

With regard again to FIG. 3B, the magnetic bilayer structure 397 also comprises a dielectric layer 323 on the magnetic layer 321. For one embodiment, the dielectric layer 323 comprises a dielectric film. Dielectric films are described above. For one embodiment, the dielectric layer 323 may comprise any suitable material or combination of materials (e.g., an epoxy dielectric material, any suitable dielectric material, any combination thereof, etc.). For a specific example, the dielectric layer 323 comprises any suitable dielectric material known in the art (e.g., a dielectric material suitable for processing by laser drilling and/or ablation techniques, a dielectric material suitable for processing by etching techniques, etc.).

Figure 3C:
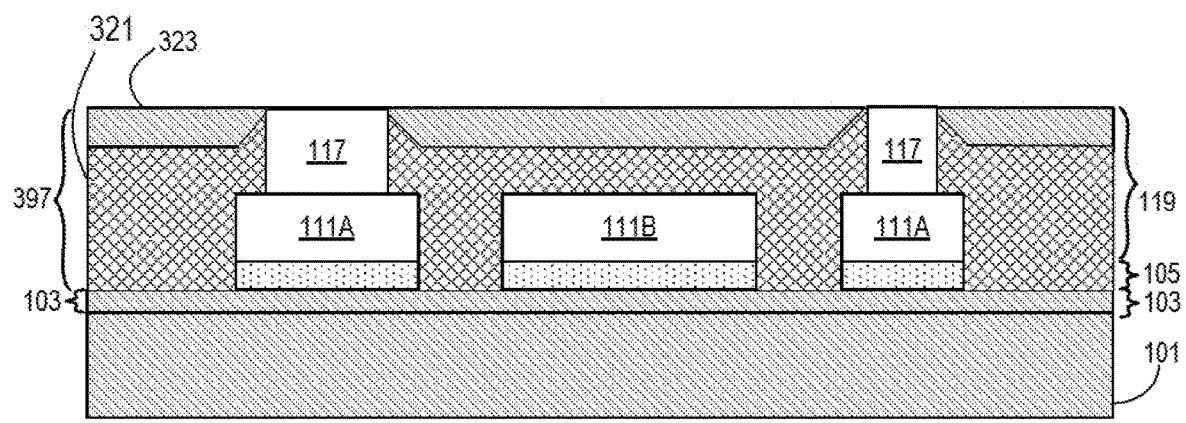

Moving on to FIG. 3C, one or more portions of the magnetic bilayer structure 397 may be removed until top surfaces of the raised pad structures 119 are uncovered or revealed. Any suitable removal technique can be used for removing the portion(s) of the dielectric layer 223 (e.g., laser drilling and/or ablation techniques, etching techniques, etc.). Any suitable removal technique can be used for removing the portion(s) of the magnetic layer 321 (e.g., mechanical planarization techniques (e.g., grinding, polishing, etc.), chemical planarization techniques, and any combination thereof. For an embodiment, one or more mechanical planarization techniques may be used.

Figure 3D:
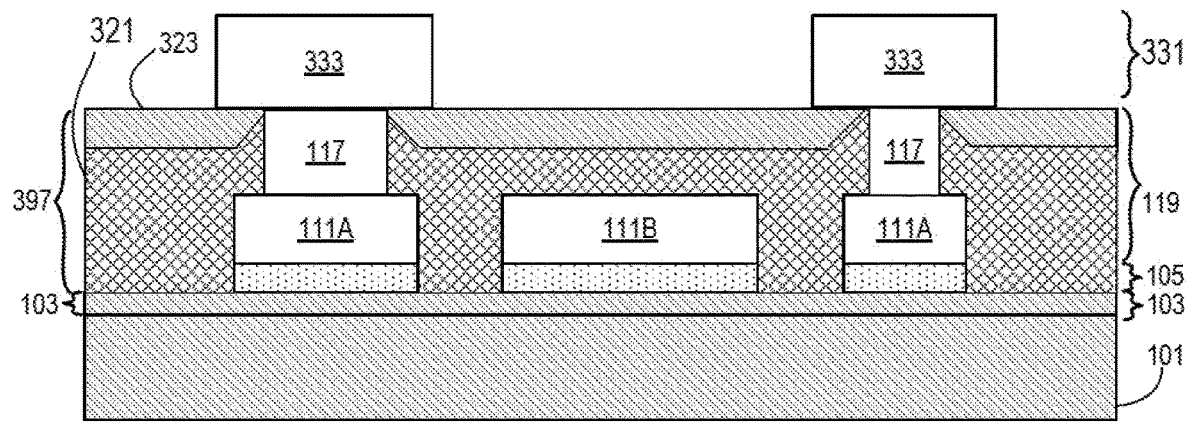

Moving now to FIG. 3D, one or more layer(s) 331 may be formed after the top surfaces of the raised pad structures 119 are uncovered or revealed. The layer(s) 331 may include any suitable layers (e.g., seed layer, resist layer, passivation layer, etc.). As shown in FIG. 3D, conductive structures 333 are formed over top surfaces of the raised pad structures 119. In this way, the structures 333 assist with coupling the raised pad structures 119 to the layer(s) 331. The conductive structures 333 may be formed using any suitable technique(s). For one example, formation of conductive structures 333 may include one or more of the following operations: (i) depositing a seed layer on top surfaces of the dielectric layer 323 and the raised pad structures 119; (ii) depositing a resist layer on the seed layer; (ii) patterning the resist layer by exposing one or more portions of the resist layer using one or more lithography techniques; (iii) removing any unexposed portion(s) of the resist layer to create openings above the top surfaces of the raised pad structures 119 in the remaining portion(s) of the resist layer; and (iv) plating one or more conductive materials (e.g., metal, metal alloy, etc.) into the openings above the top surfaces of the raised pad structures 119. In the illustrated embodiment shown in FIG. 3D, the conductive structures 333 are shown as pillars. Other embodiments, however, are not so limited. The structures 333 may have any shape and/or size (e.g., z-height, etc.). For example, the structures 333 may be pads, traces, etc.

Figure 3E:
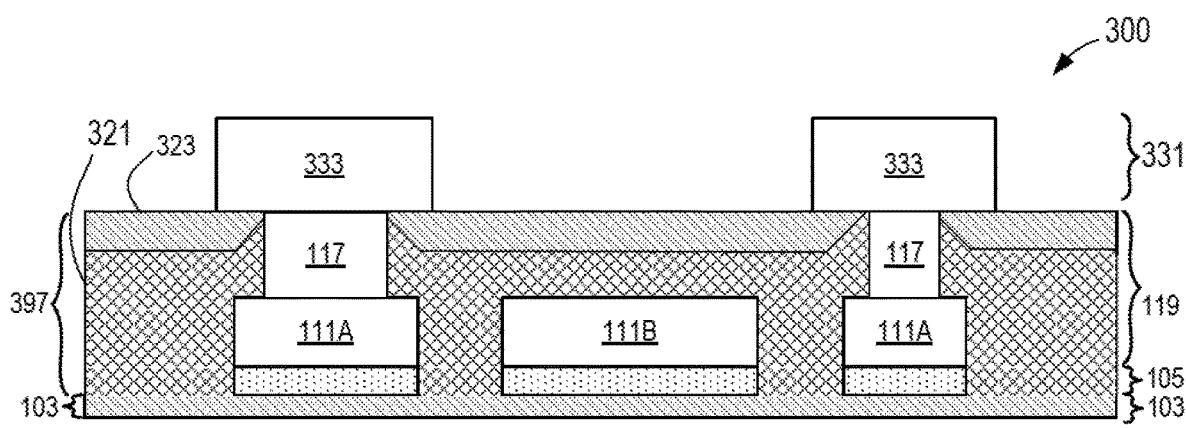

Moving on FIG. 3E, the blank panel 101 may be removed or peeled off the build-up layer 103. Removing the blank panel 101 is described above in connection with at least FIG. 1P.

After the operations shown in FIG. 3E are performed, a coreless semiconductor package portion 300 comprising the magnetic bilayer structure 397 is formed. The semiconductor package portion 300 may be subjected additional operations/processes (not shown in FIGS. 3A-3E) in order to fabricate a complete semiconductor package. These additional operations/processes include one or more current semiconductor fabrication processes that comply with current industry standards. Examples include, but are not limited to, desmearing processes, electroless plating processes, seed etching processes, and processes involving roughening baths. For one embodiment, a complete semiconductor package may comprise one or more portions 300. For one embodiment, the semiconductor package portion 300 has advantages that are similar to or the same as the advantages described above in connection the portion 100.

Figure 3F:
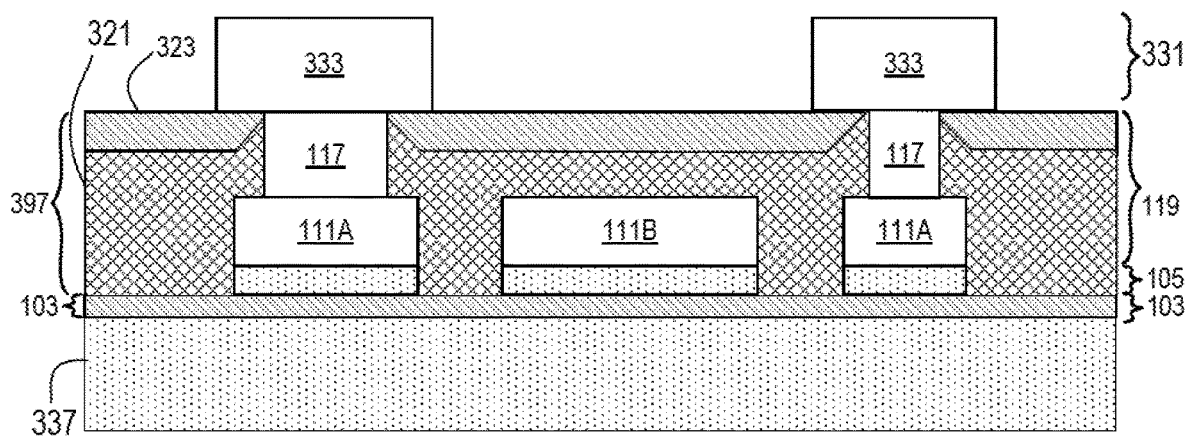
Figure 3G:
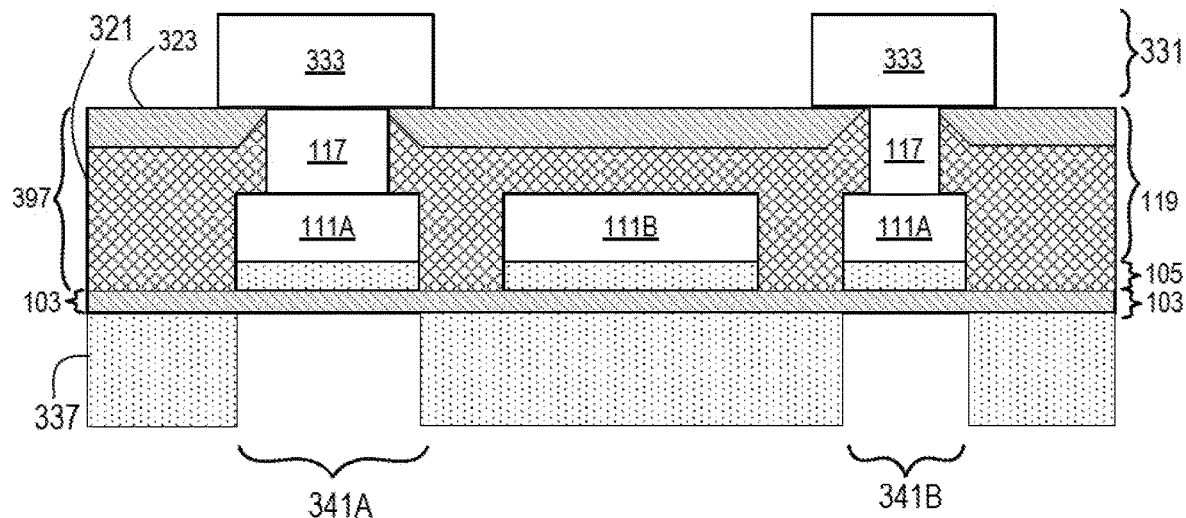
Figure 3H:
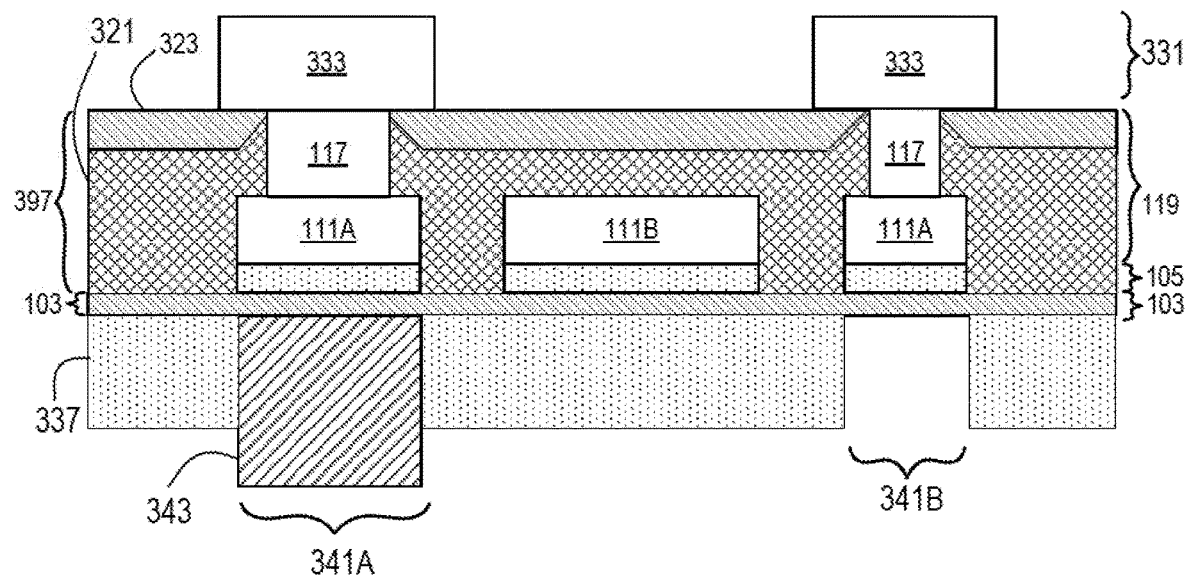

Referring now to FIGS. 3F-3H, which illustrate one or more exemplary additional operations/processes that may be performed after the coreless semiconductor package portion 300 is formed. With specific regard to FIG. 3F, after the coreless semiconductor package portion 300 is formed, a solder resist composition 337 is formed or deposited on a surface of the build-up layer 103. For one embodiment, forming or depositing the solder resist composition 337 is performed by laminating the solder resist composition 337 on an uncovered bottom surface of the build-up layer 103.

Moving on to FIG. 3G, one or more portions of the solder resist composition 337 and one or more portions of the build-up layer 103 may be removed or etched away using one or more suitable techniques that create openings 341A-B. For one embodiment, the openings 341A-B are designed such that surfaces of the seed layer 105 are partially or completely uncovered. Techniques used to create the openings 341A-B include laser drilling, laser ablation, etching, chemical stripping, lithography, any other suitable technique, and any combination of suitable techniques known in the art.

Referring now to FIG. 3H, a magnetic material 343 may be deposited into one or more of the openings 341A-B. For a non-limiting example, and as shown in FIG. 3H, a magnetic material 343 is deposited into the opening 341A. The magnetic material 343 is similar to or the same as the magnetic material 143 described above in connection with at least FIG. 1S.

After the operations described in connection with FIG. 3H are performed, a coreless semiconductor package portion 390 comprising a magnetic bilayer structure 397 and a magnetic material 343 is formed. The semiconductor package portion 390 may be subjected additional operations/processes (not shown in FIGS. 3A-3H) in order to fabricate a complete semiconductor package. One or more of these additional operations/processes are described above in connection with at least FIGS. 1A-1S. For one embodiment, a complete semiconductor package may comprise one or more portions 390. Furthermore, the semiconductor package portion 390 has advantages that are similar to or the same as the advantages described above in connection with the semiconductor package portion 100.

FIGS. 4A-4I are cross-sectional side view illustrations of a method of forming a coreless semiconductor package comprising a magnetic bilayer structure according to one or more embodiments. The method shown in FIGS. 4A-4I omits one or more processes, operations, and/or steps known in the art of semiconductor manufacturing and/or packaging for simplicity and to avoid obscuring or convoluting one or more of the inventive concepts described herein.

Figure 4A:
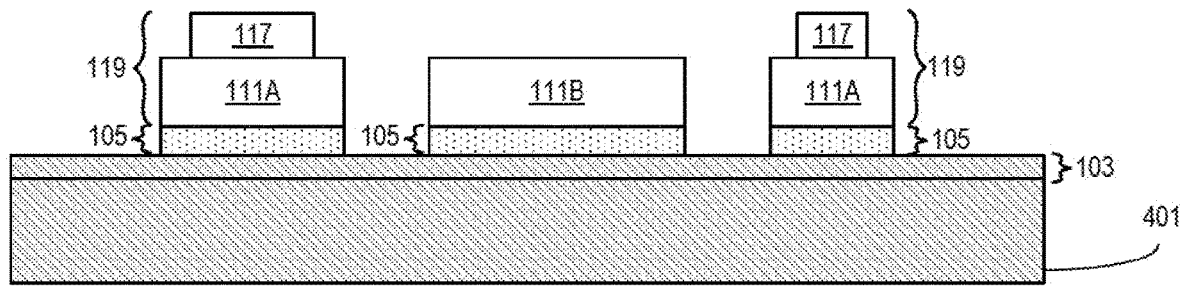

FIG. 4A illustrates a semiconductor package portion that is formed after operations similar to those described above in connection with FIGS. 1A-1J are performed. For brevity, only the differences between the operations used to form the semiconductor package portion illustrated in FIG. 4A and the operations used to form the semiconductor package portion illustrated in FIG. 1J are described below in connection with FIGS. 4A-4I.

With specific regard to FIG. 4A, a package substrate 401 is provided instead of the blank panel 101, which is described above in connection with at least FIGS. 1A-1J. The package substrate 401 resides on a cored or coreless substrate (not shown). The cored or coreless substrate on which the package substrate 401 resides may be processed using a semi-additive process (SAP). The cored or coreless substrate on which the package substrate 101 resides may be formed from any suitable materials known in the art (e.g., metal, metal alloys, silicon, epoxy resins, organic materials, inorganic materials, any combination thereof, etc.). The cored or coreless substrate on which the package substrate 401 resides may comprise a semiconductor substrate. The semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the cored or coreless substrate on which the package substrate 101 resides may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of embodiments described herein.

For one embodiment, the cored or coreless substrate on which the package substrate 401 resides comprises an organic substrate. For one embodiment, the cored or coreless substrate on which the package substrate 401 resides comprises an epoxy dielectric material (e.g., an Ajinomoto Build-up Film (ABF), any other suitable epoxy dielectric material, etc.), liquid crystal polymer, benzocyclobutene (BCB), polyimide, prepreg (a weaved fiber network "pre-impregnated" into an epoxy matrix), epoxy, or any combination thereof. For one embodiment, the cored or coreless substrate on which the package substrate 401 resides comprises inorganic fillers, such as silica. For one embodiment, the cored or coreless substrate on which the package substrate 401 is a multi-chip package substrate. For one embodiment, the cored or coreless substrate on which the package substrate 401 is a System-in-Package (SiP) substrate. For another embodiment, substrate is an interposer substrate.

For one embodiment, the cored or coreless substrate on which the package substrate 401 resides includes metal layers comprising conductive lines, pads, and/or electronic devices for integrated circuits (ICs). Examples of these electronic devices include, but are not limited to, transistors, memories, capacitors, inductors, resistors, optoelectronic devices, switches, and any other active and passive electronic devices that are separated by an electrically insulating layer, for example, an interlayer dielectric, a trench insulation layer, or any other insulating layer known in the art of the semiconductor manufacturing and/or packaging. For one or more embodiments, the cored or coreless substrate on which the package substrate 401 resides includes interconnects, for example, vias, configured to connect the metal layers.

The cored or coreless substrate may be processed and/or manufactured using semi-additive processing (SAP) technology. The SAP process flow can include pre-treating the cored or coreless substrate on which the package substrate 401 is pre-treated. This pre-treatment can include one or more of: (i) a surface roughening process; and (ii) formation of one or more metal layers on the cored or coreless substrate. Surface roughening is known in the art of the semiconductor manufacturing and/or packaging and may include a process of abrading a top surface of cored or coreless substrate (mechanically, chemically, or both) to improve the adhesion of the cored or coreless substrate with subsequently formed layers and structures (e.g., metal layer(s), the package substrate 101, etc.). Surface roughening may be performed on a dielectric layer (e.g., a layer or portion thereof formed using an epoxy dielectric material, etc.). Pre-treatment of the cored or coreless substrate may also include forming one or more metal layers after surface roughening is performed. For example, the SAP process flow may include depositing a seed layer on a dielectric layer, depositing a resist layer on the seed layer, using a lithography process to create a patterned resist layer, selectively depositing metal in the patterned resist layer to form a metal layer, and subsequently removing any remaining portions of the resist, seed, and dielectric layers such that only the metal layer remains on the cored or coreless layer. For an embodiment, the metal layer(s) may be formed by a conventional electroplating process. The metal layer(s) may include copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum (Pt), or any combination thereof. For one embodiment, conductive layers include a metal alloy or a compound that includes copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), molybdenum (Mo), palladium (Pd), gold (Au), silver (Au), or platinum (Pt), or any combination thereof. For other embodiments, the metal layer(s) may comprise any suitable material or combination of materials known in the art.

With regard again to FIG. 4A, for some embodiments, the package substrate 401 may be similar to or the same as the cored or coreless substrate described above. One or more layers are formed, fabricated, deposited, printed, laminated, and/or applied on the package substrate 401. At least one of the layers on the package substrate 401 is described above in connection with at least FIGS. 1A-1S. For brevity, the previously described layers are not described again in connection with FIGS. 4A-4I below.

With specific regard again to FIG. 4A, uncovered portion(s) of the seed layer 105 may be removed to uncover or reveal one or more portions of the build-up layer 103. For one embodiment, no portion of the seed layer 105 is on the uncovered portion(s) of the build-up layer 103. This removal operation is performed subsequent to removal of the patterned resist layer 113. The uncovered portion(s) of the seed layer 105 may be removed by conventional techniques, such as by use of one or more etching techniques known in the art, any other suitable technique used for removing seed layers known in the art, and any combination of suitable techniques used for removing seed layers known in the art.

Figure 4B:
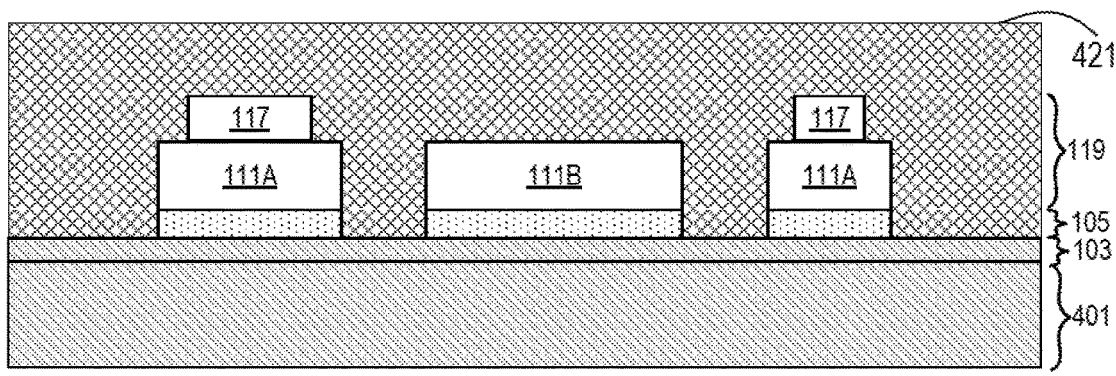

Referring now to FIG. 4B, a magnetic film 421 is used to encapsulate the raised pad structures 119 (i.e., the pads 111A and the corresponding pillar structures 117 on the pads 111A), the other inductor features 111B (e.g., conductive lines 111B, etc.), uncovered portions of the seed layer 105, and uncovered portions of the build-up layer 103. For one embodiment, the magnetic film 421 is similar to or the same as the magnetic layer 121 described above in connection with at least FIGS. 1A-1S.

Figure 4C:
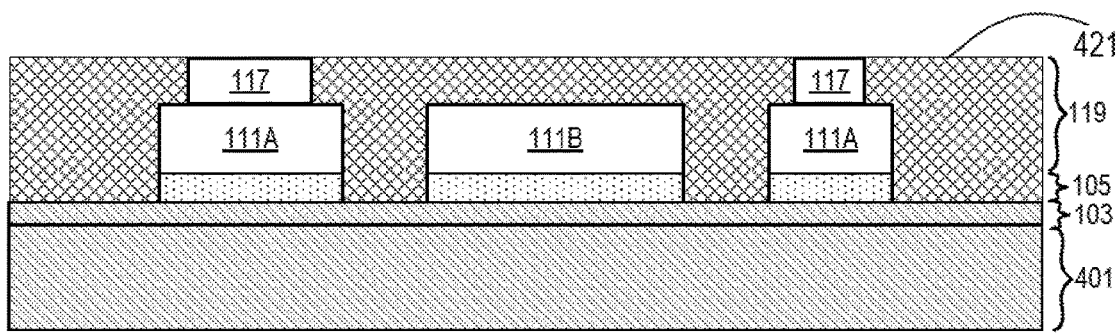

Referring now to FIG. 4C, one or more planarization techniques may be used to make top surfaces of the raised pad structures 119 and the magnetic film 421 co-planar (or substantially co-planar) with each other. For one embodiment, the planarization technique(s) are similar to or the same as the planarization technique(s) described above in connection with at least FIGS. 1A-1S.

Figure 4D:
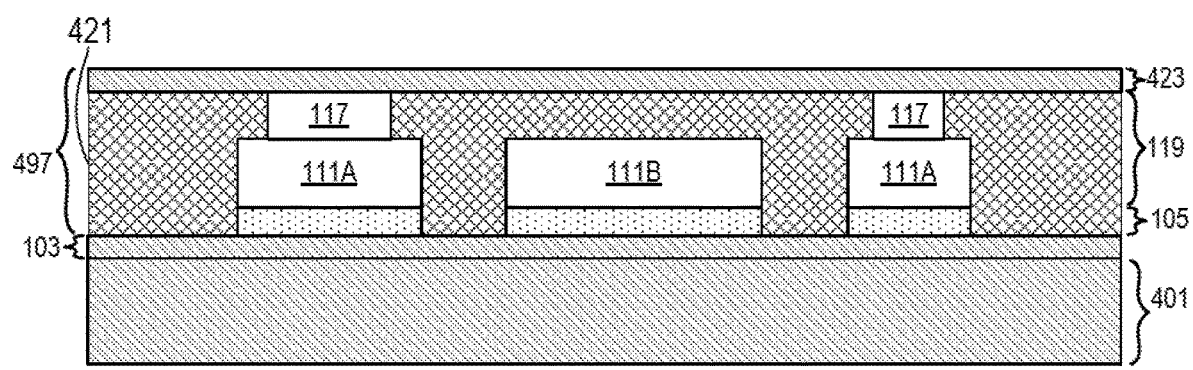

With regard now to FIG. 4D, a dielectric layer 423 may be deposited on, applied to, or formed on the co-planar (or substantially co-planar) top surfaces of the raised pad structures 119 and magnetic film 421. For one embodiment, the dielectric layer 423 is similar to or the same as the dielectric layer 123 described above in connection with at least FIGS. 1A-1S. For one embodiment, the dielectric layer 423 and the magnetic film 421 collectively form a magnetic bilayer structure 497. The magnetic bilayer structure 497 is similar to or the same as the magnetic bilayer structure 197 described above in connection with at least FIGS. 1A-1S.

Figure 4E:
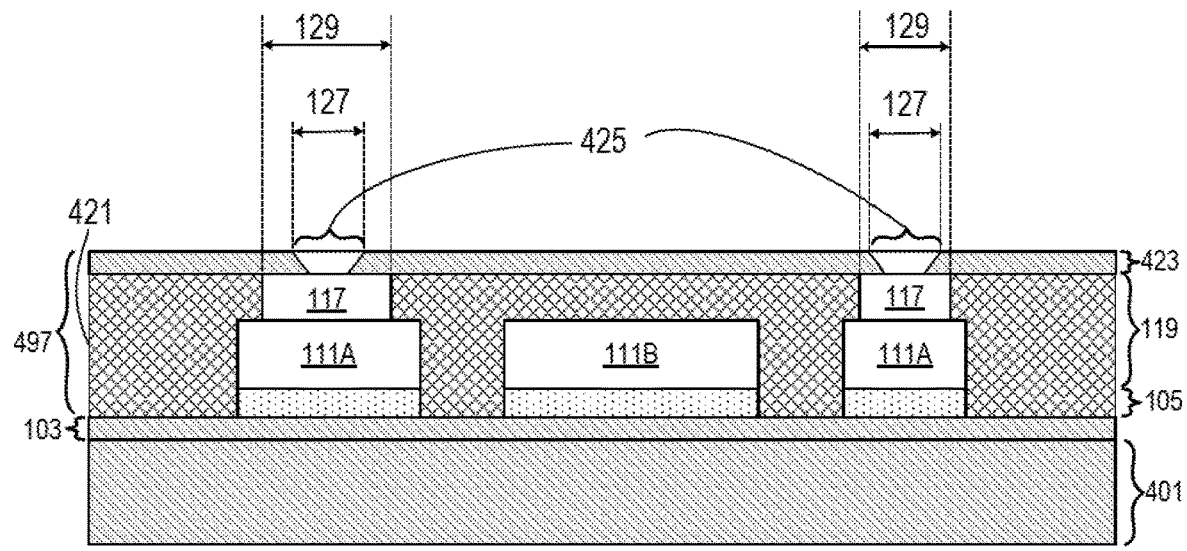

Moving on to FIG. 4E, vias 425 may be formed on the magnetic bilayer structure 497 by removing portions of the dielectric layer 423 above the raised pad structures 119. Removing portions of the dielectric layer 423 above the raised pad structures 119 can be performed by laser drilling, laser ablation, chemical etching techniques, lithography techniques, any suitable removal technique, and any combination of suitable techniques known in the art of semiconductor fabrication. The vias 425 are similar to or the same as the vias 125 described above in connection at least FIGS. 1A-1S.

Figure 4F:
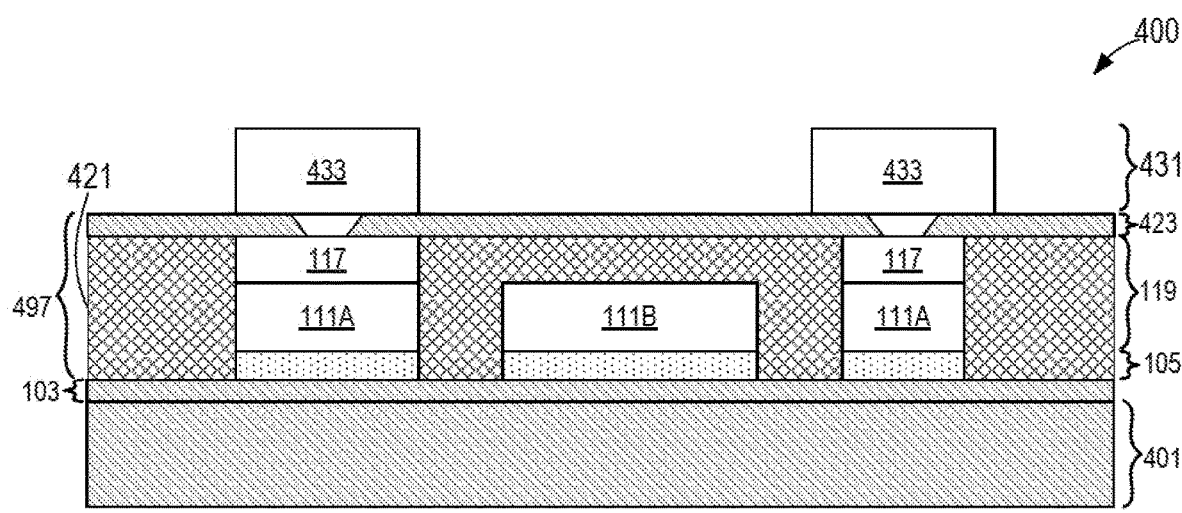

Moving now to FIG. 4F, one or more layer(s) 431 may be formed after vias 425 are formed. The layer(s) 431 are similar to or the same as the layer(s) 131 described above in connection at least FIGS. 1A-1S. As shown in FIG. 4F, conductive structures 433 are formed over the vias 425 for coupling the raised pad structures 119 to the layer(s) 431. The conductive structures 433 may be formed using any suitable technique(s). For one example, formation of conductive structures 433 may include one or more of the following operations: (i) depositing a seed layer on top surfaces of the dielectric layer 423 and the raised pad structures 119; (i) depositing a resist layer on the seed layer; (ii) patterning the resist layer by exposing one or more portions of the resist layer using one or more lithography techniques; (iii) removing any unexposed portion(s) of the resist layer to create openings above the vias 425 in the remaining portion(s) of the resist layer; and (iv) plating one or more conductive materials (e.g., metal, metal alloy, etc.) into the openings above the vias 425. For an alternate example, the seed layer is deposited in the openings above the vias 425 prior to plating one or more metal layers into the openings above the vias 425. In the illustrated embodiment shown in FIG. 4F, the conductive structures 433 are shown as pillars. Other embodiments, however, are not so limited. The structures 433 may have any shape and/or size (e.g., z-height, etc.). For one example, the structures 433 may be pads.

After the operations shown in FIG. 4F are performed, a cored or coreless semiconductor package portion 100 comprising a magnetic bilayer structure 497 is formed. The semiconductor package portion 400 may be subjected additional operations/processes (not shown in FIGS. 4A-4F) in order to fabricate a complete semiconductor package. These additional operations/processes include one or more current semiconductor fabrication processes that comply with current industry standards. Examples include, but are not limited to, desmearing processes, electroless plating processes, seed etching processes, and processes involving roughening baths. For one embodiment, a complete semiconductor package may comprise one or more portions 400. For one embodiment, the semiconductor package portion 400 has advantages that are similar to or the same as the advantages described above in connection with package portion 100.

Figure 4G:
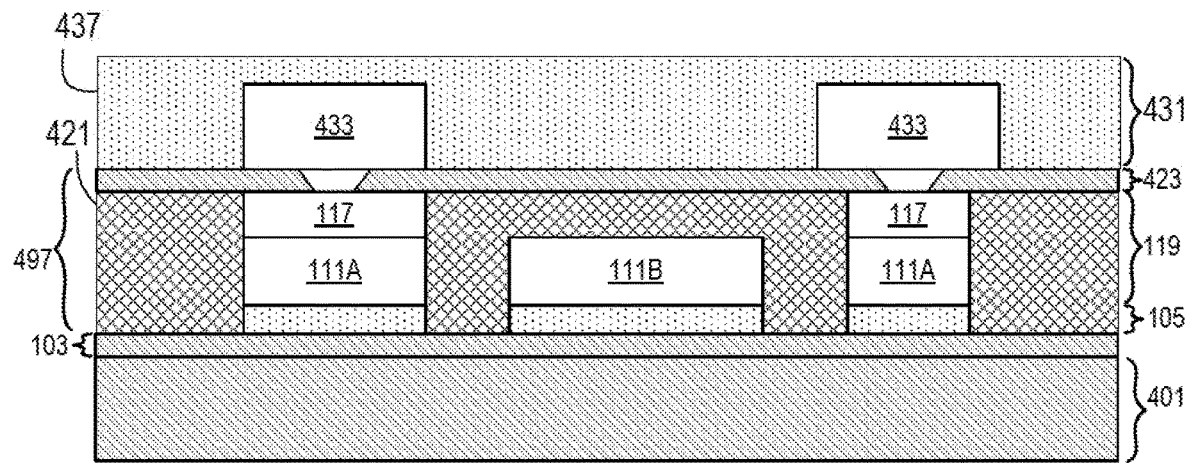
Figure 4H:
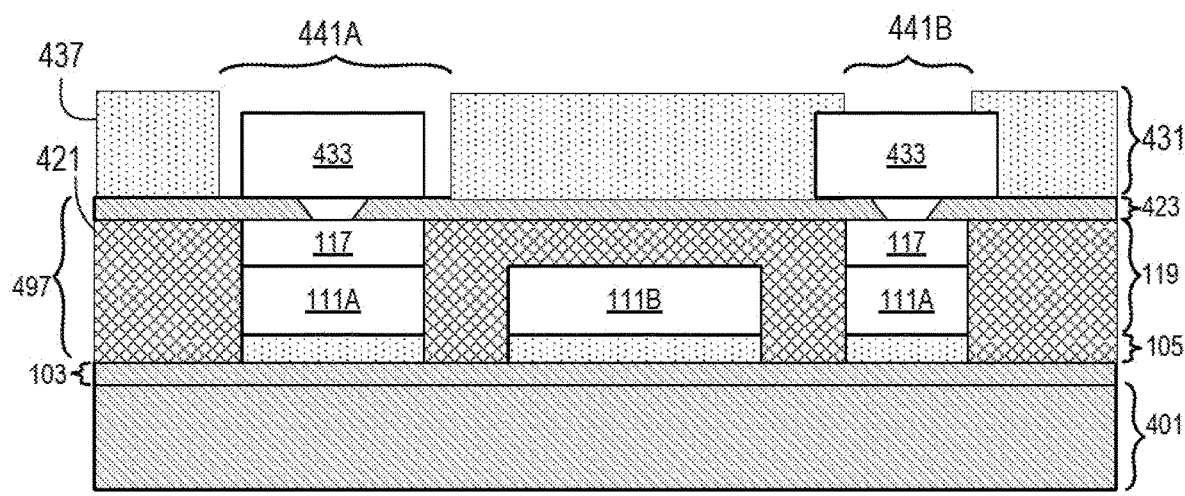

Referring now to FIGS. 4G-4I, which illustrate one or more exemplary additional operations/processes that may be performed after the semiconductor portion 400 is formed. With specific regard to FIG. 4G, formation of the layer(s) 431 may include encapsulating the conductive structures 433 and the uncovered top surfaces of the layer(s) 423 in a solder resist composition 437. For one embodiment, encapsulation of the conductive structures 433 and the uncovered top surfaces of the layer(s) 423 is performed by lamination of the solder resist composition 437.

Moving on to FIG. 4H, the solder resist composition 437 may be opened using one or more suitable techniques that create openings 441A-B. For one embodiment, the openings 441A-B are designed such that top surfaces of the conductive structures 433 are partially or completely uncovered. For one embodiment, the opening 441A is designed such that: (i) one or more portions of the solder resist composition 437 encapsulating a top and/or side surfaces of the conductive structures 433 are removed; and (ii) one or more portions of the solder resist composition 437 encapsulating one or more portions of a top surface of the layer(s) 423 are removed. For a further embodiment, the exposed or uncovered portion(s) of the top surface of the layer(s) 423 are adjacent to the exposed or uncovered conductive structures 433. Techniques used to create the openings 441A-B include laser drilling, laser ablation, etching, chemical stripping, lithography, any other suitable technique, and any combination of suitable techniques known in the art.

Referring now to FIG. 4I, a magnetic material 443 may be deposited into the openings 441A-B and used to encapsulate the conductive structures 433. The magnetic material 443 can be similar to or the same as the magnetic material 143 described above in connection at least FIGS. 1A-1S.

After the operations described in connection with FIG. 4I are performed, a cored semiconductor package portion 490A or a coreless semiconductor package portion 490B is formed. When the package substrate 401 is a blank panel, the coreless package portion 490B is created after removing the package substrate 401. For one embodiment, each of the package portions 490A-B comprises a magnetic bilayer structure 497 and a magnetic material 443. Each of the semiconductor package portions 490A-B may be subjected additional operations/processes (not shown in FIGS. 4A-4I) in order to fabricate a complete semiconductor package. One or more of these additional operations/processes are described above in connection with at least FIGS. 1A-1S. For one embodiment, a complete semiconductor package may comprise one or more portions 490A-B. Furthermore, each of the semiconductor package portions 490A-B has similar or the same advantages as the advantages described above in connection with the semiconductor package portion 100.

FIGS. 5A-5G are cross-sectional side view illustrations of a method of forming a coreless semiconductor package comprising a magnetic bilayer structure according to one or more embodiments. The method shown in FIGS. 5A-5G omits one or more processes, operations, and/or steps known in the art of semiconductor manufacturing and/or packaging for simplicity and to avoid obscuring or convoluting one or more of the inventive concepts described herein.

Figure 5A:
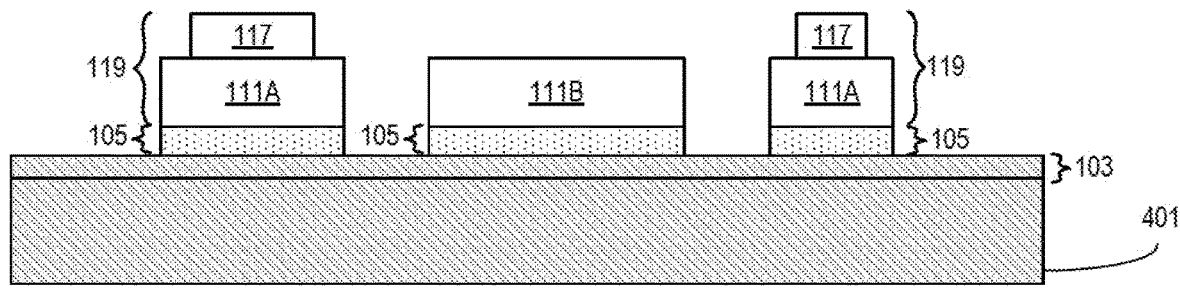

FIG. 5A illustrates a semiconductor package portion that is formed after the operations described above in connection with FIG. 4A are performed. With specific regard now to FIG. 5A, uncovered portion(s) of the seed layer 105 may be removed to uncover or reveal one or more portions of the build-up layer 103. For one embodiment, no portion of the seed layer 105 is on the uncovered portion(s) of the build-up layer 103. This removal operation is performed subsequent to removal of the patterned resist layer 113. The uncovered portion(s) of the seed layer 105 may be removed by conventional techniques, such as by use of one or more etching techniques known in the art, any other suitable technique used for removing seed layers known in the art, and any combination of suitable techniques used for removing seed layers known in the art.

Figure 5B:
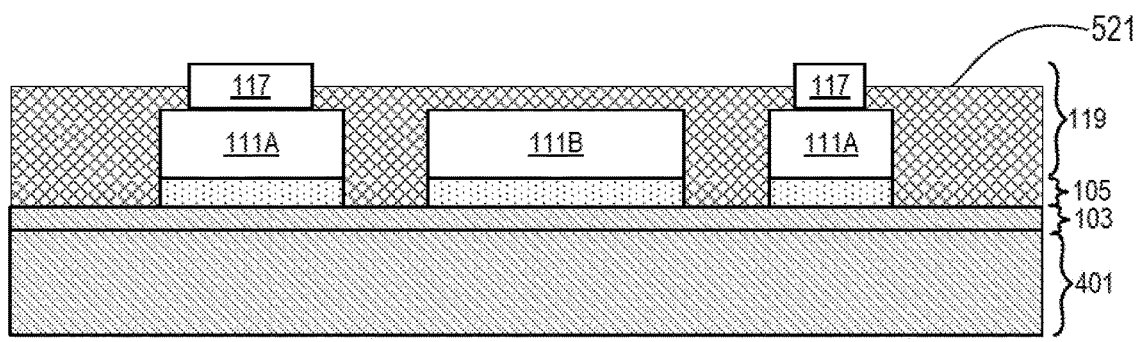

Referring now to FIG. 5B, a magnetic layer 521 is used to encapsulate the raised pad structures 119 (i.e., the pads 111A and the corresponding pillar structures 117 on the pads 111A), the other inductor features 111B (e.g., conductive lines 111B, etc.), uncovered portions of the seed layer 105, and uncovered portions of the build-up layer 103. For one embodiment, the magnetic layer 521 is similar to or the same as the magnetic layer 221 described above in connection with at least FIGS. 2A-2G.

Figure 5C:
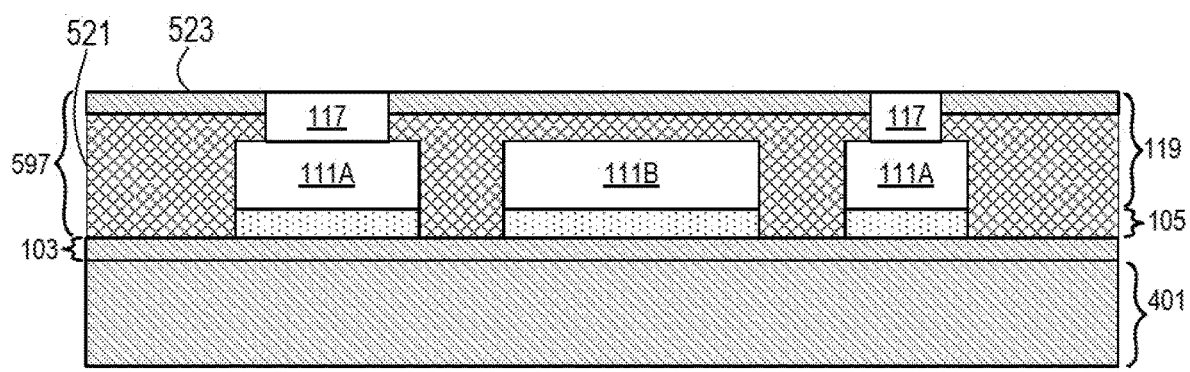

With regard now to FIG. 5C, a dielectric layer 523 may be deposited on, applied to, or formed on uncovered top surfaces of magnetic layer 521 such that uncovered top surfaces of the raised pad structures 119 remain uncovered and uncovered side surfaces of the raised pad structures 119 are covered by the dielectric layer 523. For one embodiment, the dielectric layer 523 may be deposited on, applied to, or formed on uncovered top surfaces of magnetic layer 521, uncovered top surfaces of the raised pad structures 119, and uncovered side surfaces of the raised pad structures 119. For this embodiment, one or more portions of the dielectric layer 523 may be removed until top surfaces of the raised pad structures 119 are uncovered or revealed. Any suitable removal technique can be used for removing the portion(s) of the dielectric layer 523 (e.g., laser drilling and/or ablation techniques, etching techniques, etc.). For one embodiment, the dielectric layer 523 is similar to or the same as the dielectric layer 223 described above in connection with at least FIGS. 2A-2G. For one embodiment, a magnetic bilayer structure 597 comprises the dielectric layer 523 and the magnetic layer 521. For one embodiment, the magnetic bilayer structure 597 is similar to or the same as the magnetic bilayer structure 297 described above in connection with at least FIGS. 2A-2G.

Figure 5D:
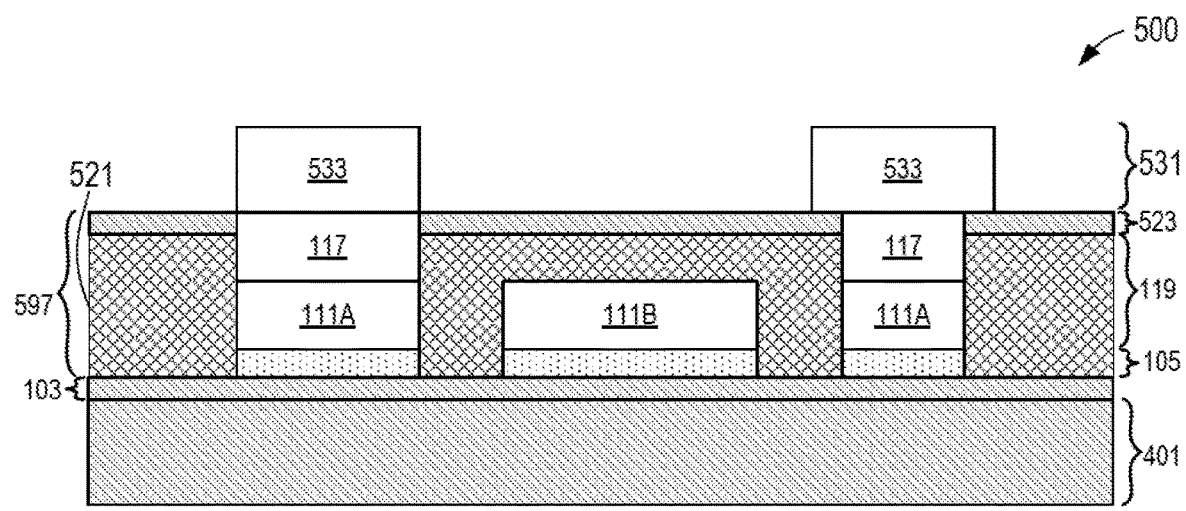

Moving now to FIG. 5D, one or more layer(s) 531 may be formed after the magnetic bilayer structure 597 is formed. The layer(s) 531 may include any suitable layers (e.g., seed layer, resist layer, passivation layer, etc.). As shown in FIG. 5D, conductive structures 533 are formed over top surfaces of the raised pad structures 119. In this way, the structures 533 assist with coupling the raised pad structures 119 to the layer(s) 531. The conductive structures 533 may be formed using any suitable technique(s). For one example, formation of conductive structures 533 may include one or more of the following operations: (i) depositing a seed layer on top surfaces of the magnetic bilayer structure 597 and the raised pad structures 119; (i) depositing a resist layer on the seed layer; (ii) patterning the resist layer by exposing one or more portions of the resist layer using one or more lithography techniques; (iii) removing any unexposed portion(s) of the resist layer to create openings above the top surfaces of the raised pad structures 119 in the remaining portion(s) of the resist layer; and (iv) plating one or more conductive materials (e.g., metal, metal alloy, etc.) into the openings above the top surfaces of the raised pad structures 119. In the illustrated embodiment shown in FIG. 5D, the conductive structures 533 are shown as pillars. Other embodiments, however, are not so limited. The structures 533 may have any shape and/or size (e.g., z-height, etc.). For example, the structures 533 may be pads, traces, etc. For one embodiment, the structures 533 are similar to or the same as the structures 233 described above in connection with at least FIGS. 2A-2G.

After the operations shown in FIG. 5D are performed, a coreless semiconductor package portion 500 comprising the magnetic bilayer structure 597 is formed. The semiconductor package portion 500 may be subjected additional operations/processes (not shown in FIGS. 5A-5D) in order to fabricate a complete semiconductor package. These additional operations/processes include one or more current semiconductor fabrication processes that comply with current industry standards. Examples include, but are not limited to, desmearing processes, electroless plating processes, seed etching processes, and processes involving roughening baths. For one embodiment, a complete semiconductor package may comprise one or more portions 500. For one embodiment, the semiconductor package portion 500 has advantages that are similar to or the same as the advantages described above in connection the portion 100.

Figure 5E:
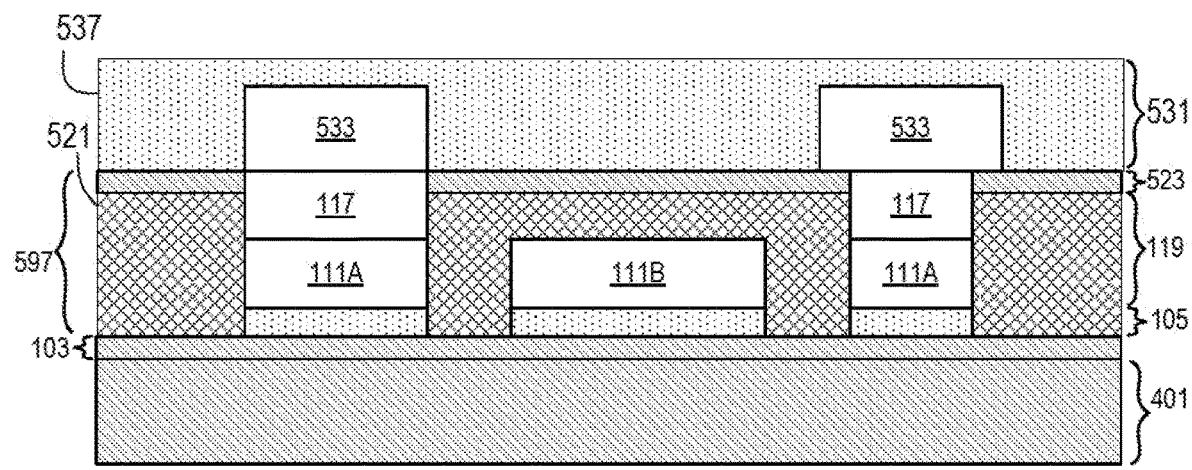
Figure 5F:
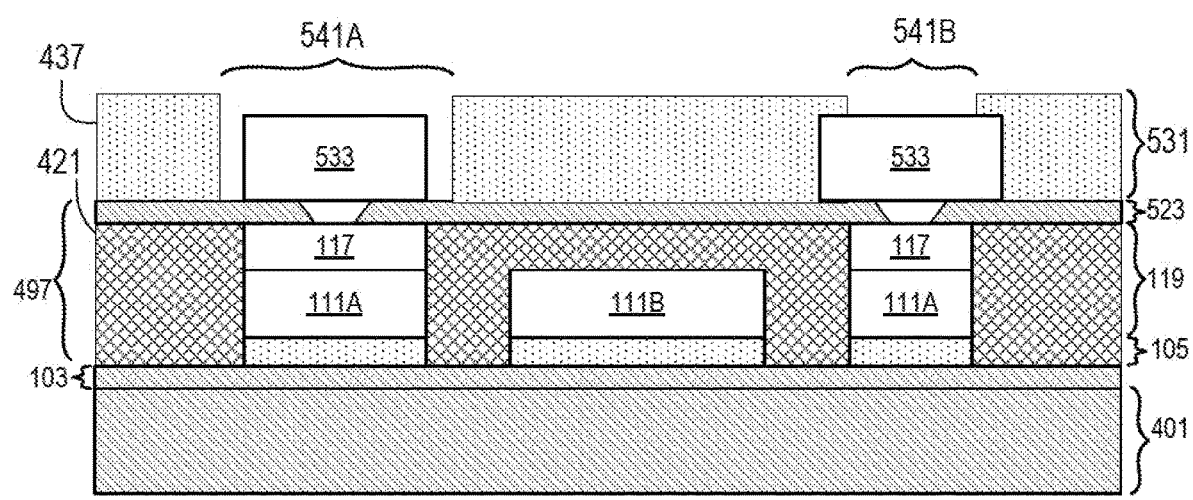

Referring now to FIGS. 5E-5G, which illustrate one or more exemplary additional operations/processes that may be performed after the coreless semiconductor package portion 500 is formed. With specific regard to FIG. 5E, formation of the layer(s) 531 may include encapsulating the conductive structures 533 and the uncovered top surfaces of the layer(s) 523 in a solder resist composition 537. For one embodiment, encapsulation of the conductive structures 533 and the uncovered top surfaces of the layer(s) 523 is performed by lamination of the solder resist composition 537.

Moving on to FIG. 5F, the solder resist composition 537 may be opened using one or more suitable techniques that create openings 541A-B. For one embodiment, the openings 541A-B are designed such that top surfaces of the conductive structures 533 are partially or completely uncovered. For one embodiment, the opening 541A is designed such that: (i) one or more portions of the solder resist composition 537 encapsulating a top and/or side surfaces of the conductive structures 533 are removed; and (ii) one or more portions of the solder resist composition 537 encapsulating one or more portions of a top surface of the layer(s) 523 are removed. For a further embodiment, the exposed or uncovered portion(s) of the top surface of the layer(s) 523 are adjacent to the exposed or uncovered conductive structures 533. Techniques used to create the openings 541A-B include laser drilling, laser ablation, etching, chemical stripping, lithography, any other suitable technique, and any combination of suitable techniques known in the art.

Referring now to FIG. 5G, a magnetic material 543 may be deposited into the openings 541A-B and used to encapsulate the conductive structures 533. The magnetic material 543 can be similar to or the same as the magnetic material 143 described above in connection at least FIGS. 1A-1S.

After the operations described in connection with FIG. 5G are performed, a cored semiconductor package portion 590A or a coreless semiconductor package portion 590B is formed. When the package substrate 401 is a blank panel, the coreless package portion 590B is created after removing the package substrate 401. For one embodiment, each of the package portions 590A-B comprises a magnetic bilayer structure 597 and a magnetic material 543. Each of the semiconductor package portions 590A-B may be subjected additional operations/processes (not shown in FIGS. 5A-5G) in order to fabricate a complete semiconductor package. One or more of these additional operations/processes are described above in connection with at least FIGS. 1A-1S. For one embodiment, a complete semiconductor package may comprise one or more portions 590A-B. Furthermore, each of the semiconductor package portions 590A-B has similar or the same advantages as the advantages described above in connection with the semiconductor package portion 100.

FIGS. 6A-6G are cross-sectional side view illustrations of a method of forming a coreless semiconductor package comprising a magnetic bilayer structure according to one or more embodiments. The method shown in FIGS. 6A-6G omits one or more processes, operations, and/or steps known in the art of semiconductor manufacturing and/or packaging for simplicity and to avoid obscuring or convoluting one or more of the inventive concepts described herein.

Figure 6A:
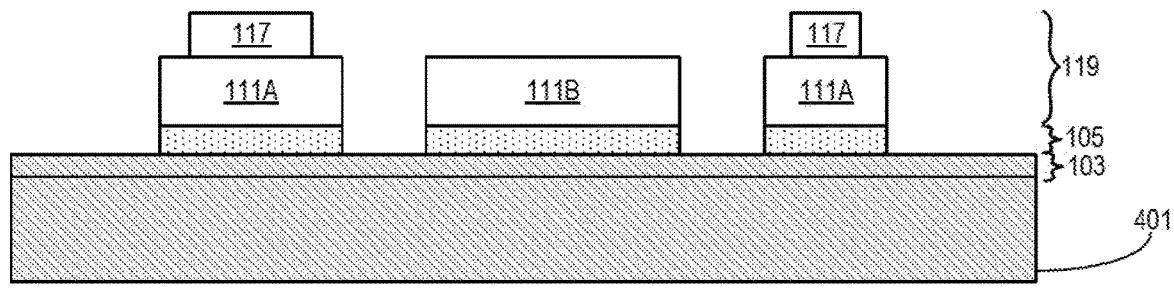

FIG. 6A illustrates a semiconductor package portion that is formed after the operations described above in connection with FIG. 4A are performed. With specific regard now to FIG. 6A, uncovered portion(s) of the seed layer 105 may be removed to uncover or reveal one or more portions of the build-up layer 103. For one embodiment, no portion of the seed layer 105 is on the uncovered portion(s) of the build-up layer 103. This removal operation is performed subsequent to removal of the patterned resist layer 113. The uncovered portion(s) of the seed layer 105 may be removed by conventional techniques, such as by use of one or more etching techniques known in the art, any other suitable technique used for removing seed layers known in the art, and any combination of suitable techniques used for removing seed layers known in the art.

Figure 6B:
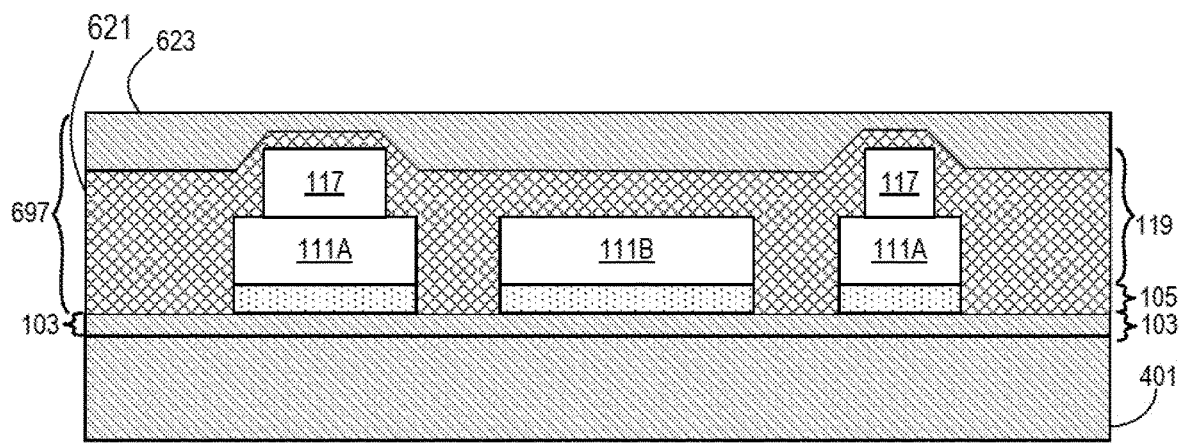

Referring now to FIG. 6B, a magnetic bilayer structure 697 is used to encapsulate the raised pad structures 119 (i.e., the pads 111A and the corresponding pillar structures 117 on the pads 111A), the other inductor features 111B (e.g., conductive lines 111B, etc.), uncovered portions of the seed layer 105, and uncovered portions of the build-up layer 103. For one embodiment, the magnetic bilayer structure 697 comprises a magnetic layer 621 and a dielectric layer 623. For one embodiment, the magnetic bilayer structure 697 is similar to or the same as the magnetic bilayer structure 397 described above in connection with at least FIGS. 3A-3H. For one embodiment, the magnetic layer 621 is similar to or the same as the magnetic layer 321 described above in connection with at least FIGS. 3A-3H. For one embodiment, the dielectric layer 623 is similar to or the same as the dielectric layer 323 described above in connection with at least FIGS. 3A-3H.

Figure 6C:
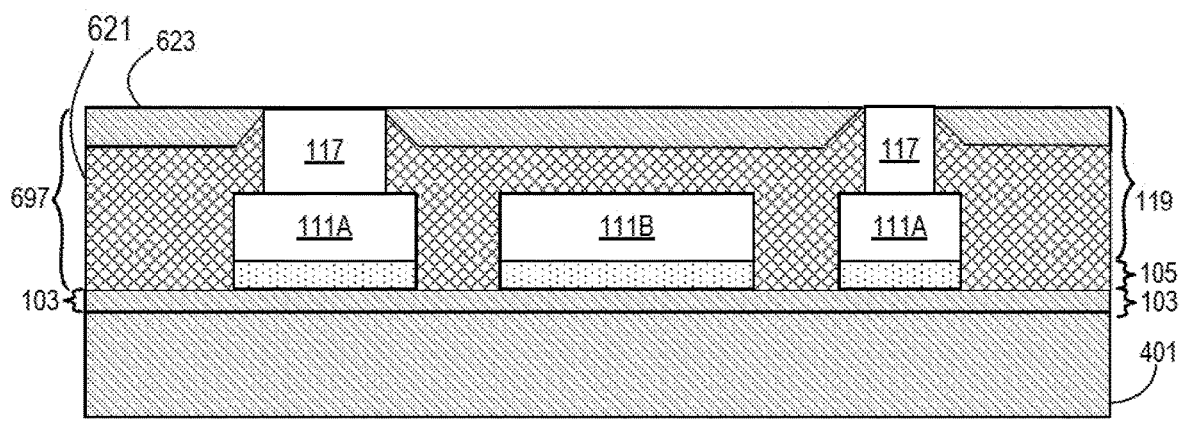

Moving on to FIG. 6C, one or more portions of the magnetic bilayer structure 697 may be removed until top surfaces of the raised pad structures 119 are uncovered or revealed. Any suitable removal technique can be used for removing the portion(s) of the dielectric layer 623 (e.g., laser drilling and/or ablation techniques, etching techniques, etc.). Any suitable removal technique can be used for removing the portion(s) of the magnetic layer 621 (e.g., mechanical planarization techniques (e.g., grinding, polishing, etc.), chemical planarization techniques, and any combination thereof. For an embodiment, one or more mechanical planarization techniques may be used.

Figure 6D:
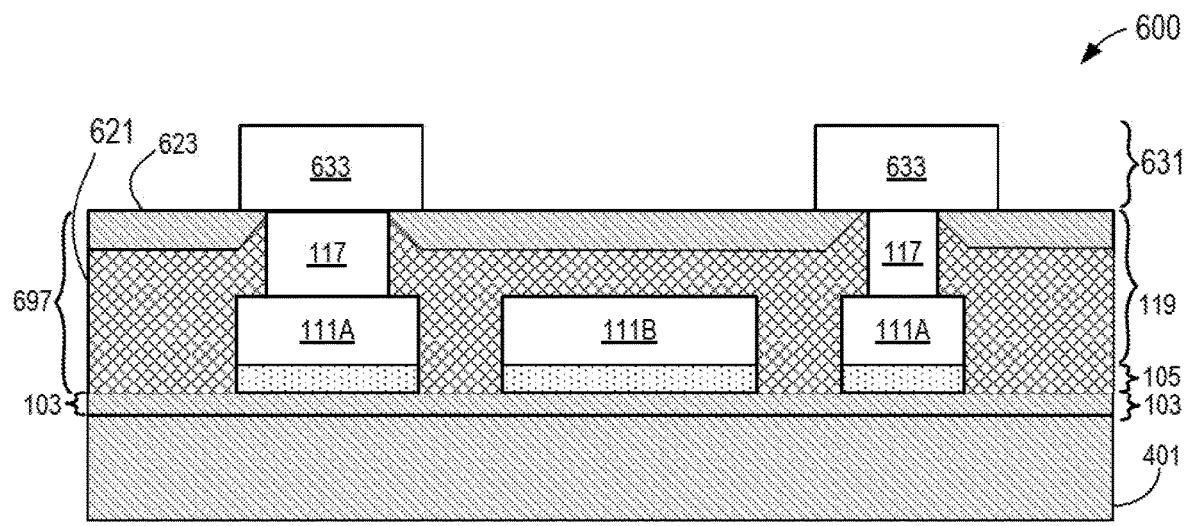

Moving now to FIG. 6D, one or more layer(s) 631 may be formed after the magnetic bilayer structure 697 is formed. The layer(s) 631 may include any suitable layers (e.g., seed layer, resist layer, passivation layer, etc.). As shown in FIG. 6D, conductive structures 633 are formed over top surfaces of the raised pad structures 119. In this way, the structures 633 assist with coupling the raised pad structures 119 to the layer(s) 631. The conductive structures 633 may be formed using any suitable technique(s). For one example, formation of conductive structures 633 may include one or more of the following operations: (i) depositing a seed layer on top surfaces of the magnetic bilayer structure 697 and the raised pad structures 119; (i) depositing a resist layer on the seed layer; (ii) patterning the resist layer by exposing one or more portions of the resist layer using one or more lithography techniques; (iii) removing any unexposed portion(s) of the resist layer to create openings above the top surfaces of the raised pad structures 119 in the remaining portion(s) of the resist layer; and (iv) plating one or more conductive materials (e.g., metal, metal alloy, etc.) into the openings above the top surfaces of the raised pad structures 119. In the illustrated embodiment shown in FIG. 6D, the conductive structures 633 are shown as pillars. Other embodiments, however, are not so limited. The structures 633 may have any shape and/or size (e.g., z-height, etc.). For example, the structures 633 may be pads, traces, etc. For one embodiment, the structures 633 are similar to or the same as the structures 333 described above in connection with at least FIGS. 3A-3H.

After the operations shown in FIG. 6D are performed, a coreless semiconductor package portion 600 comprising the magnetic bilayer structure 697 is formed. The semiconductor package portion 600 may be subjected additional operations/processes (not shown in FIGS. 6A-6D) in order to fabricate a complete semiconductor package. These additional operations/processes include one or more current semiconductor fabrication processes that comply with current industry standards. Examples include, but are not limited to, desmearing processes, electroless plating processes, seed etching processes, and processes involving roughening baths. For one embodiment, a complete semiconductor package may comprise one or more portions 600. For one embodiment, the semiconductor package portion 600 has advantages that are similar to or the same as the advantages described above in connection the portion 100.

Figure 6E:
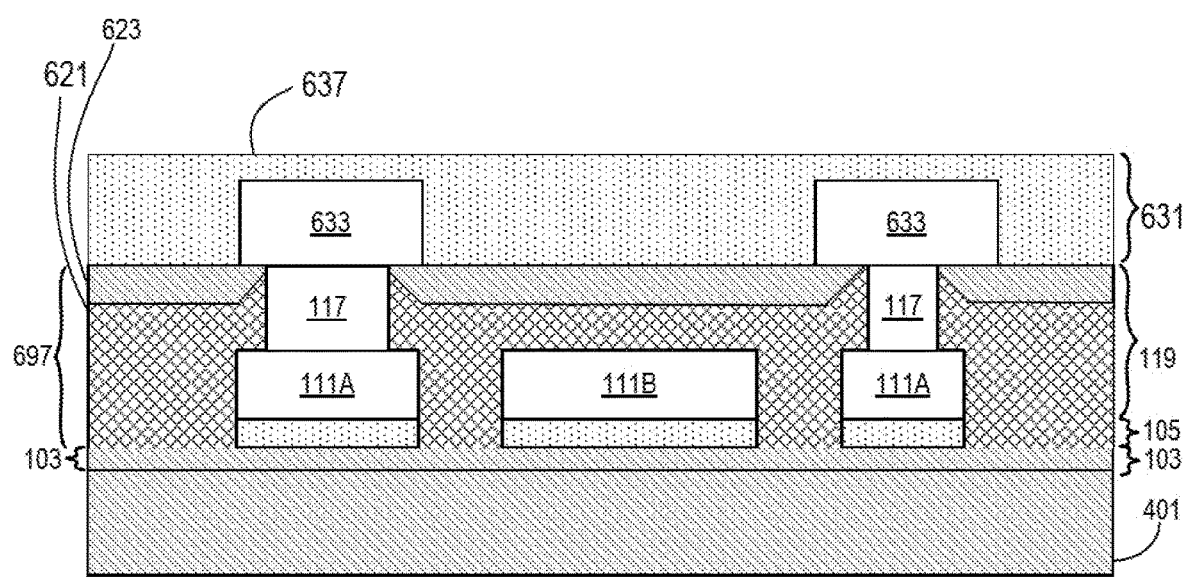
Figure 6F:
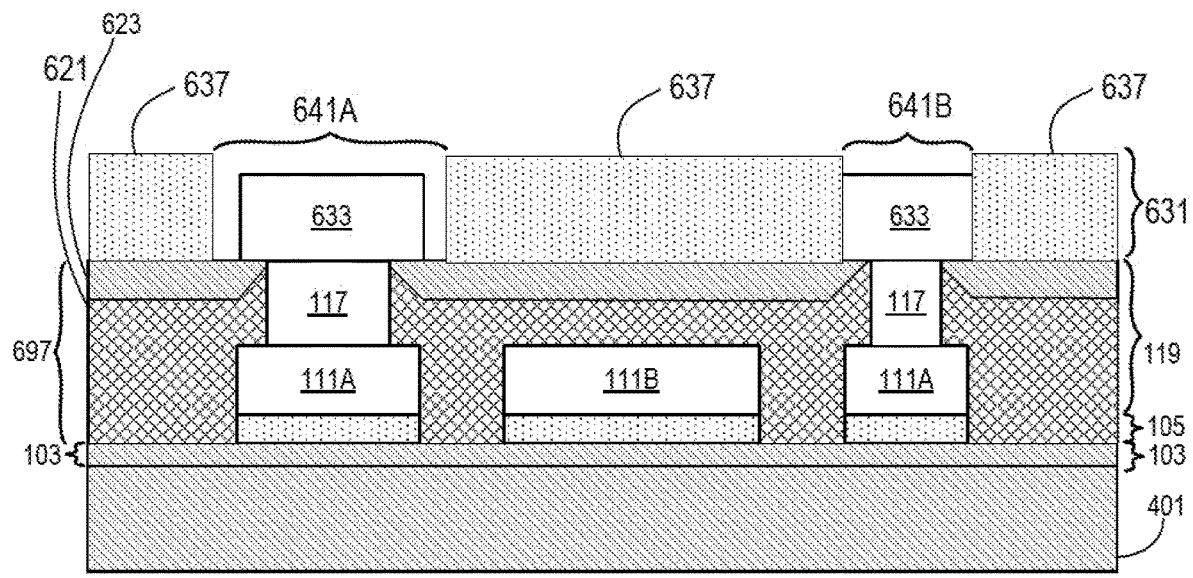

Referring now to FIGS. 6E-6G, which illustrate one or more exemplary additional operations/processes that may be performed after the coreless semiconductor package portion 600 is formed. With specific regard to FIG. 6E, formation of the layer(s) 631 may include encapsulating the conductive structures 633 and the uncovered top surfaces of the layer(s) 623 in a solder resist composition 637. For one embodiment, encapsulation of the conductive structures 633 and the uncovered top surfaces of the layer(s) 623 is performed by lamination of the solder resist composition 637.

Moving on to FIG. 6F, the solder resist composition 637 may be opened using one or more suitable techniques that create openings 641A-B. For one embodiment, the openings 641A-B are designed such that top surfaces of the conductive structures 633 are partially or completely uncovered. For one embodiment, the opening 641A is designed such that: (i) one or more portions of the solder resist composition 637 encapsulating a top and/or side surfaces of the conductive structures 633 are removed; and (ii) one or more portions of the solder resist composition 637 encapsulating one or more portions of a top surface of the layer(s) 623 are removed. For a further embodiment, the exposed or uncovered portion(s) of the top surface of the layer(s) 623 are adjacent to the exposed or uncovered conductive structures 633. Techniques used to create the openings 641A-B include laser drilling, laser ablation, etching, chemical stripping, lithography, any other suitable technique, and any combination of suitable techniques known in the art.

Referring now to FIG. 6G, a magnetic material 643 may be deposited into the openings 641A-B and used to encapsulate the conductive structures 633. The magnetic material 643 can be similar to or the same as the magnetic material 143 described above in connection at least FIGS. 1A-1S.

After the operations described in connection with FIG. 6G are performed, a cored semiconductor package portion 690A or a coreless semiconductor package portion 690B is formed. When the package substrate 401 is a blank panel, the coreless package portion 690B is created after removing the package substrate 401. For one embodiment, each of the package portions 690A-B comprises a magnetic bilayer structure 697 and a magnetic material 643. Each of the semiconductor package portions 690A-B may be subjected additional operations/processes (not shown in FIGS. 6A-6G) in order to fabricate a complete semiconductor package. One or more of these additional operations/processes are described above in connection with at least FIGS. 1A-1S. For one embodiment, a complete semiconductor package may comprise one or more portions 690A-B. Furthermore, each of the semiconductor package portions 690A-B has similar or the same advantages as the advantages described above in connection with the semiconductor package portion 100.

Referring now to FIG. 7, a cross-sectional illustration of a packaged system 700 is shown, in accordance with an embodiment. For an embodiment, the packaged system 700 may include a semiconductor die 740 electrically coupled to a package substrate 770 with solder bumps 743. For additional embodiments, the semiconductor die 740 may be electrically coupled to the package substrate 770 with any suitable interconnect architecture, such as wire bonding or the like. The package substrate 770 may be electrically coupled to a board, such as a printed circuit board (PCB) 780, with solder bumps 773. For additional embodiments, the package substrate 770 may be electrically coupled to a board, such as the PCB 780, with any suitable interconnect architecture, such as wire bonding or the like.

For an embodiment, an inductor 710 formed based on one or more of the embodiments described above may be integrated into: (i) the package substrate 770; (ii) the board 780; or (iii) the package substrate 770 and the board 780. Embodiments include any number of inductors 710 formed into the package substrate 770 and/or the board 780. For example, a plurality of inductors 710 may be integrated—for power management, filtering, or any other desired use—into: (i) the package substrate 770; (ii) the board 780; or (iii) the package substrate 770 and the board 780.

Figure 8:
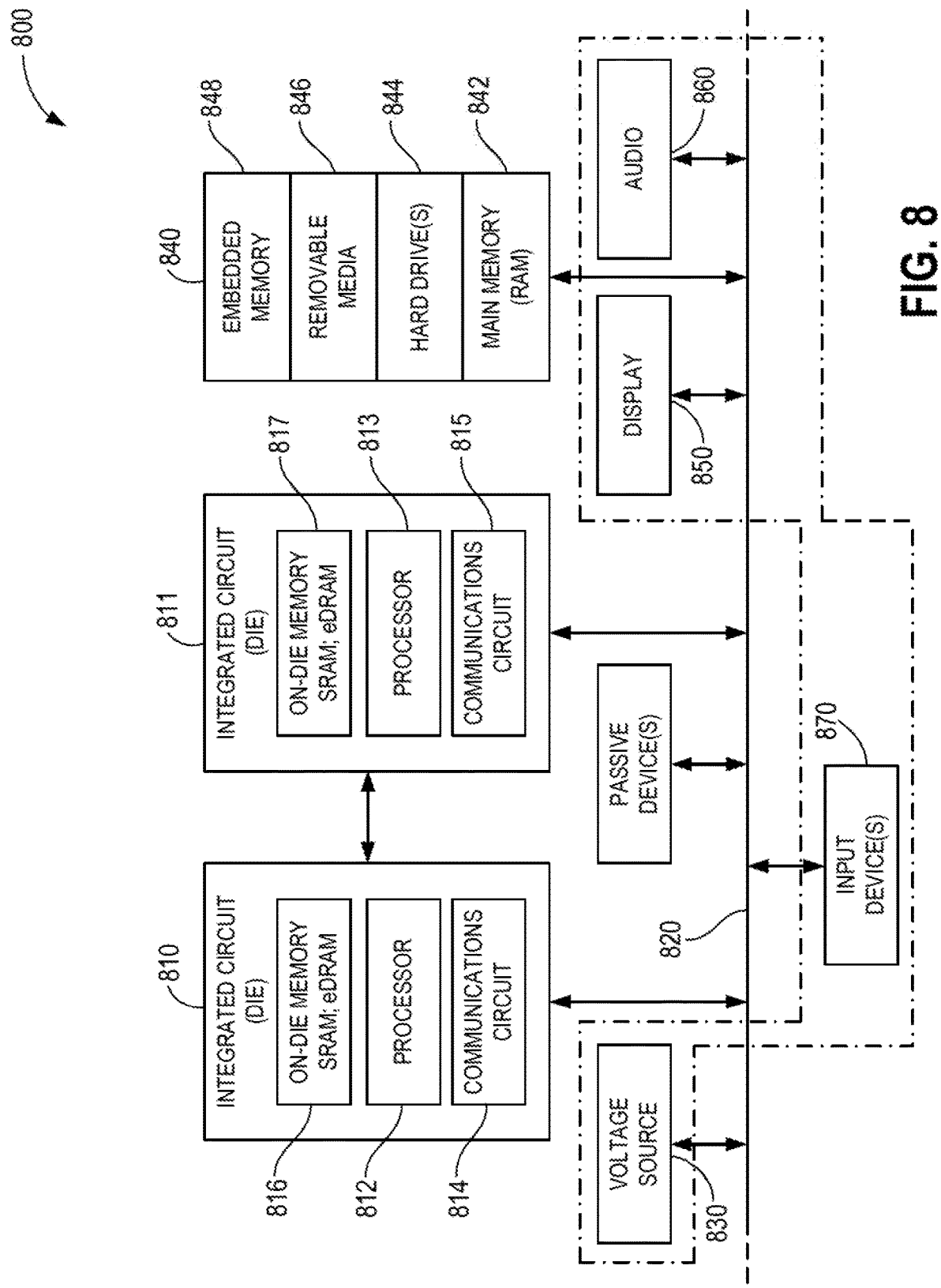
FIG. 8 is an illustration of a schematic block diagram of a computer system that utilizes a semiconductor package, according to an embodiment.

FIG. 8 illustrates a schematic of computer system 800 according to an embodiment. The computer system 800 (also referred to as an electronic system 800) can include a semiconductor package having one or more magnetic materials embedded therein in accord with any of the embodiments and their equivalents as set forth in this disclosure. The computer system 800 may be a mobile device, a netbook computer, a wireless smart phone, a desktop computer, a hand-held reader, a server system, a supercomputer, or a high-performance computing system.

The system 800 can be a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. For one embodiment, the voltage source 830 supplies current to the integrated circuit 810 through the system bus 820.

The integrated circuit 810 is electrically coupled to the system bus 820 and includes any circuit, or combination of circuits according to an embodiment. For an embodiment, the integrated circuit 810 includes a processor 812. As used herein, the processor 812 may mean any type of circuit such as, but not limited to, a microprocessor, a microcontroller, a graphics processor, a digital signal processor, or another processor. For an embodiment, the processor 812 includes, or is coupled with, a semiconductor package having one or more magnetic materials embedded therein in accord with any of the embodiments and their equivalents, as described in the foregoing specification. For an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. For an embodiment, the integrated circuit 810 includes on-die memory 816 such as static random-access memory (SRAM). For an embodiment, the integrated circuit 810 includes embedded on-die memory 816 such as embedded dynamic random-access memory (eDRAM). For one embodiment, the on-die memory 816 may be packaged with a process in accord with any of the embodiments and their equivalents, as described in the foregoing specification.

For an embodiment, the integrated circuit 810 is complemented with a subsequent integrated circuit 811. Useful embodiments include a dual processor 813 and a dual communications circuit 815 and dual on-die memory 817 such as SRAM. For an embodiment, the dual integrated circuit 810 includes embedded on-die memory 817 such as eDRAM.

For an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

For an embodiment, the electronic system 800 also includes a display device 850 and an audio output 860. For an embodiment, the electronic system 800 includes an input device such as a controller 870 that may be a keyboard, mouse, trackball, game controller, microphone, voice-recognition device, or any other input device that inputs information into the electronic system 800. For an embodiment, an input device 870 is a camera. For an embodiment, an input device 870 is a digital sound recorder. For an embodiment, an input device 870 is a camera and a digital sound recorder.

At least one of the integrated circuits 810 or 811 can be implemented in a number of different embodiments, including a semiconductor package having one or more magnetic materials embedded therein as described herein, an electronic system, a computer system, one or more methods of fabricating an integrated circuit, and one or more methods of fabricating an electronic assembly that includes a semiconductor package having one or more magnetic materials embedded therein, according to any disclosed embodiments set forth herein and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the semiconductor package having one or more magnetic materials embedded therein in accordance with any of the disclosed embodiments as set forth herein and their art-recognized equivalents. A foundation substrate may be included, as represented by the dashed line of FIG. 8. Passive devices may also be included, as is also depicted in FIG. 8.

Reference throughout this specification to "one embodiment," "an embodiment," "another embodiment" and their variations means that a particular feature, structure, configuration, or characteristic described in connection with the embodiment is included in at least one embodiment. Thus, the appearances of the phrase "for one embodiment," "for an embodiment," "for another embodiment," "in one embodiment," "in an embodiment," "in another embodiment," or their variations in various places throughout this specification are not necessarily referring to the same embodiment. Furthermore, the particular features, structures, configurations, or characteristics may be combined in any suitable manner in one or more embodiments.

The terms "over," "to," "between," "onto," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The description provided above in connection with one or more embodiments as described herein that is included as part of a process of forming semiconductor packages may also be used for other types of IC packages and mixed logic-memory package stacks. In addition, the processing sequences may be compatible with both wafer level packages (WLP), and integration with surface mount substrates such as LGA, QFN, and ceramic substrates.

In the foregoing specification, abstract, and/or figures, numerous specific details are set forth, such as specific materials and processing operations, in order to provide a thorough understanding of embodiments described herein. It will, however, be evident that any of the embodiments described herein may be practiced without these specific details. In other instances, well-known features, such as the integrated circuitry of semi conductive dies, are not described in detail in order to avoid obscuring or convoluting one or more of the embodiments described herein. Furthermore, it is to be understood that the various embodiments shown in the Figures and described in connection with the Figures are illustrative representations and are not necessarily drawn to scale. Thus, various modifications and/or changes may be made without departing form the broader spirit and scope of the embodiments described in connection with the foregoing specification, abstract, and/or Figures.

Embodiments described herein include a method of forming a cored or coreless semiconductor package, comprising: depositing a seed layer on a build-up layer; forming a raised pad structure and a trace on the seed layer; removing one or more uncovered portions of the seed layer to uncover top surfaces of one or more portions of the build-up layer; applying a magnetic bilayer structure on the raised pad structure, the trace, one or more unremoved portions of the seed layer, and the top surfaces of the one or more portions of the build up layer, the magnetic bilayer structure comprises a magnetic layer and a dielectric layer; and forming a conductive structure on the raised pad structure.

Additional embodiments include a method according to one or more embodiments described herein, wherein the raised pad structure has a z-height that is larger than a z-height of the trace.

Additional embodiments include a method according to one or more embodiments described herein, wherein a size of the via is less than or equal to a corresponding size of the raised pad structure.

Additional embodiments include a method according to one or more embodiments described herein, further comprising removing one or more portions of the magnetic bilayer structure above the raised pad structure to form a via on the raised pad structure, wherein the conductive structure is formed over the via.

Additional embodiments include a method according to one or more embodiments described herein, wherein the magnetic layer comprises one or more of: a film comprising one or more magnetic fillers; a paste comprising one or more magnetic fillers; and an ink comprising one or more magnetic fillers.

Additional embodiments include a method according to one or more embodiments described herein, wherein the dielectric layer is formed from a dielectric material lacking magnetic fillers.

Additional embodiments include a method according to one or more embodiments described herein, wherein a top surface of the magnetic layer is co-planar with the top surface of the raised pad structure.

Additional embodiments include a method according to one or more embodiments described herein, further comprising applying a planarization technique to the magnetic layer until the top surfaces of the magnetic layer and the raised pad structure are co planar.

Additional embodiments include a method according to one or more embodiments described herein, wherein a top surface of the dielectric layer is co-planar with the top surface of the raised pad structure.

Additional embodiments include a method according to one or more embodiments described herein, further comprising applying removal technique to the dielectric layer until the top surfaces of the dielectric layer and the raised pad structure are co planar.

Additional embodiments include a method according to one or more embodiments described herein, wherein the removal technique comprises one or more of: (i) a laser drilling technique; (ii) a laser ablation technique; and (iii) an etching technique.

Additional embodiments include a method according to one or more embodiments described herein, wherein the magnetic bilayer structure comprises a prepackaged structure that comprises a dielectric film laminated on a magnetic film.

Additional embodiments include a method according to one or more embodiments described herein, wherein forming the raised pad structure and the trace on the seed layer comprises: forming a pad and the trace, wherein forming the pad and the trace comprises lithographically exposing portions of a first resist layer on the seed layer, removing the exposed portions of the first resist layer to create a first set of openings, depositing metallic materials in the first set of openings, and removing any lithographically unexposed portion of the first resist layer; and forming a pillar structure on the pad to create the raised pad structure, wherein forming the pillar structure comprises lithographically exposing a portion of a second resist layer on uncovered surfaces of the pad, the trace, and the build-up layer, removing the exposed portion of the second resist layer to create a second opening on the pad, depositing metallic materials in the second opening, and removing any lithographically unexposed portion of the second resist layer.

Additional embodiments include a method according to one or more embodiments described herein, wherein a magnetic film is a film comprised of: (i) one or more of an epoxy resin, a polyimide, and a glass-reinforced epoxy laminate material (e.g., FR4, G10, G11, FR4, FR5, FR6, etc.); and (ii) the one or more magnetic fillers.

Additional embodiments include a method according to one or more embodiments described herein, wherein a magnetic film comprises an organic dielectric epoxy laminate film having the one or more magnetic fillers therein.

Additional embodiments include a method according to one or more embodiments described herein, wherein at least one of the one or more magnetic fillers is formed from one or more of: (i) a ferromagnetic material; and (ii) a ferrimagnetic material.

Additional embodiments include a method according to one or more embodiments described herein, wherein at least one of the one or more magnetic fillers is formed from one or more of: iron (Fe), cobalt (Co), nickel (Ni), any ferrite that includes Fe and oxygen (O), ferrous oxide (FeO), a metal alloy comprising one or more of Fe, Co, and Ni (e.g., CoFe, NiFe, etc.), any ferromagnetic material, and any ferrimagnetic material.

Additional embodiments include a method according to one or more embodiments described herein, wherein an inductor in the cored or coreless semiconductor package comprises one or more of: the pad; the conductive line; the raised pad structure; the magnetic bilayer structure; the via; the conductive structure; and the magnetic ink.

Additional embodiments include a method according to one or more embodiments described herein, further comprising: removing a blank core attached to a bottom surface of the build-up layer; applying a solder resist composition on the bottom surface of the build-up layer; removing one or more portions of the solder resist composition that are below the raised pad structure to form one or more openings in the solder resist composition; and depositing a magnetic material in at least one of the one or more openings.

Additional embodiments include a method according to one or more embodiments described herein, wherein the magnetic material comprises one or more of a magnetic ink and a magnetic paste.

Additional embodiments include a method according to one or more of the preceding embodiments set forth above, further comprising: encapsulating the conductive structure and uncovered top surfaces of the magnetic bilayer structure in a solder resist composition; removing one or more portions of the solder resist composition that are above the conductive structure to form one or more openings in the solder resist composition; and depositing a magnetic material in at least one of the one or more openings.

Additional embodiments include a method according to one or more embodiments described herein, wherein the magnetic material comprises one or more of a magnetic ink and a magnetic paste.

Embodiments described herein include a cored or coreless semiconductor package formed according to one or more of the preceding embodiments set forth above.

In the description, drawings, and claims provided herein, the use of "at least one of A, B, and C", "at least one of A, B, or C", "one or more of A, B, or C", or "one or more of A, B, and C" is intended encompass: (i) A alone; (ii) B alone; (iii) C alone; (iv) A and B together; (v) A and C together; (vi) B and C together; or (vii) A, B, and C together. Furthermore, the use of "A, B, and/or C" is intended encompass: (i) A alone; (ii) B alone; (iii) C alone; (iv) A and B together; (v) A and C together; (vi) B and C together; or (vii) A, B, and C together. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrases "A or B", "A and B", and "A and/or B" will be understood to include the possibilities of "A alone" or "B alone" or "A and B."

The term "via" and its variations refer to a vertical interconnect access as is known in the art. The term "trace" and its variations may also be referred to a conductive line.

The terms used in the following claims should not be construed to limit any embodiments described in connection with the foregoing specification, abstract, and/or Figures to the specific embodiments set forth in the foregoing specification, abstract, Figures, and/or claims. Rather, the scope of the claims are to be construed in accordance with established doctrines of claim interpretation.

What is claimed is:

1. A semiconductor package, comprising:
    a seed layer on a build-up layer;
    a raised pad structure and a trace on the seed layer;
    a magnetic bilayer structure on the raised pad structure and the trace, wherein the magnetic bilayer structure comprises a magnetic layer and a dielectric layer, the magnetic layer in direct contact with the raised pad structure and the trace, wherein a top surface of the magnetic layer is co-planar with a top surface of the raised pad structure;
    a conductive via in an opening in the dielectric layer of the magnetic bilayer structure, the conductive via on a top surface of the raised pad structure; and
    a conductive structure on the conductive via and on a portion of a top surface of the dielectric layer of the magnetic bilayer.

2. The semiconductor package of claim 1, wherein the raised pad structure has a z-height that is larger than a z-height of the trace.

3. The semiconductor package of claim 1, wherein the magnetic layer comprises one or more of:
    a film comprising one or more magnetic fillers;
    a paste comprising one or more magnetic fillers; and
    an ink comprising one or more magnetic fillers.

4. The semiconductor package of claim 3, wherein the dielectric layer is formed from a dielectric material lacking magnetic fillers.

5. The semiconductor package of claim 1, further comprising:
    a solder resist composition on a bottom surface of the build-up layer;
    one or more openings formed in the solder resist composition and the build-up layer below the raised pad structure; and a magnetic material in at least one of the one or more openings, wherein the magnetic material comprises one or more of: an ink comprising one or more magnetic fillers; and a paste comprising one or more magnetic fillers.

6. The semiconductor package of claim 1, further comprising:
 a solder resist composition encapsulating the conductive structure and uncovered top surfaces of the magnetic bilayer structure;
 one or more openings formed in the solder resist composition above the raised pad structure; and
 a magnetic material in at least one of the one or more openings, wherein the magnetic material comprises one or more of: an ink comprising one or more magnetic fillers; and a paste comprising one or more magnetic fillers.

7. A semiconductor package, comprising:
 a seed layer on a build-up layer;
 a raised pad structure and a trace on the seed layer;
 a magnetic bilayer structure on the raised pad structure and the trace, wherein the magnetic bilayer structure comprises a prepackaged structure that comprises a dielectric film laminated on a magnetic film, the magnetic film in direct contact with the raised pad structure and the trace, wherein a top surface of the magnetic layer is co-planar with a top surface of the raised pad structure;
 a conductive via in an opening in the dielectric layer of the magnetic bilayer structure, the conductive via on a top surface of the raised pad structure; and
 a conductive structure on the conductive via and on a portion of a top surface of the dielectric layer of the magnetic bilayer.

8. The semiconductor package of claim 7, wherein the raised pad structure has a z-height that is larger than a z-height of the trace.

9. The semiconductor package of claim 7, wherein the magnetic layer comprises one or more of:
 a film comprising one or more magnetic fillers;
 a paste comprising one or more magnetic fillers; and
 an ink comprising one or more magnetic fillers.

10. The semiconductor package of claim 9, wherein the dielectric layer is formed from a dielectric material lacking magnetic fillers.

11. The semiconductor package of claim 7, further comprising:
 a solder resist composition on a bottom surface of the build-up layer;
 one or more openings formed in the solder resist composition and the build-up layer below the raised pad structure; and
 a magnetic material in at least one of the one or more openings, wherein the magnetic material comprises one or more of: an ink comprising one or more magnetic fillers; and a paste comprising one or more magnetic fillers.

12. The semiconductor package of claim 7, further comprising:
 a solder resist composition encapsulating the conductive structure and uncovered top surfaces of the magnetic bilayer structure;
 one or more openings formed in the solder resist composition above the raised pad structure; and
 a magnetic material in at least one of the one or more openings, wherein the magnetic material comprises one or more of: an ink comprising one or more magnetic fillers; and a paste comprising one or more magnetic fillers.

13. A semiconductor package, comprising:
 a seed layer on a build-up layer;
 a raised pad structure and a trace on the seed layer;
 a magnetic bilayer structure on the raised pad structure and the trace, wherein the magnetic bilayer structure comprises a magnetic layer and a dielectric layer, the magnetic layer in direct contact with the raised pad structure and the trace;
 a conductive structure on the raised pad structure over a via;
 a solder resist composition on a bottom surface of the build-up layer;
 one or more openings formed in the solder resist composition and the build-up layer below the raised pad structure; and
 a magnetic material in at least one of the one or more openings, wherein the magnetic material comprises one or more of: an ink comprising one or more magnetic fillers; and a paste comprising one or more magnetic fillers.

* * * * *